United States Patent
Cho et al.

(10) Patent No.: US 12,108,649 B2
(45) Date of Patent: Oct. 1, 2024

(54) DISPLAY PANEL AND DISPLAY DEVICE USING THE SAME

(71) Applicant: LG Display Co., Ltd., Seoul (KR)

(72) Inventors: Young Sung Cho, Paju-si (KR); Hyung Uk Jang, Paju-si (KR); Sung Woo Jun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/359,079

(22) Filed: Jun. 25, 2021

(65) Prior Publication Data
US 2022/0123071 A1    Apr. 21, 2022

(30) Foreign Application Priority Data
Oct. 19, 2020   (KR) .......................... 10-2020-0135389

(51) Int. Cl.
*H10K 59/35*    (2023.01)
*G06F 3/14*    (2006.01)
*H10K 59/126*    (2023.01)
*H10K 59/65*    (2023.01)

(52) U.S. Cl.
CPC .............. *H10K 59/65* (2023.02); *G06F 3/14* (2013.01); *H10K 59/126* (2023.02); *H10K 59/352* (2023.02); *H10K 59/353* (2023.02)

(58) Field of Classification Search
CPC ........ H01L 27/3216–3218; H10K 59/351–353
See application file for complete search history.

(56) References Cited

U.S. PATENT DOCUMENTS

| | | | | |
|---|---|---|---|---|
| 9,312,312 | B1* | 4/2016 | Tsai | H10K 59/121 |
| 2015/0138463 | A1* | 5/2015 | Jinta | H10K 59/122 |
| | | | | 349/33 |
| 2019/0043932 | A1* | 2/2019 | Shih | H10K 59/353 |
| 2019/0326366 | A1 | 10/2019 | Fan et al. | |
| 2020/0043989 | A1* | 2/2020 | Liu | H10K 59/00 |
| 2020/0105843 | A1* | 4/2020 | Baek | H10K 59/352 |
| 2020/0124927 | A1* | 4/2020 | Kim | H10K 50/822 |
| 2020/0133040 | A1* | 4/2020 | Bang | G02F 1/136227 |

(Continued)

FOREIGN PATENT DOCUMENTS

| | | |
|---|---|---|
| KR | 10-2020-0037029 A | 4/2020 |
| WO | WO 2020/034077 A1 | 2/2020 |

OTHER PUBLICATIONS

Extended European Search Report, European Patent Application No. 21182894.2, Mar. 10, 2022, 11 pages.

(Continued)

*Primary Examiner* — Eric K Ashbahian
(74) *Attorney, Agent, or Firm* — Fenwick & West LLP

(57) ABSTRACT

The present disclosure relates to a display panel and a display device using the same, and includes a first region where a plurality of pixel groups are disposed; and a second region where a plurality of pixel groups and a plurality of light transmitting parts are disposed. The plurality of pixel groups disposed in the second region are disposed between the light transmitting parts. An aspect ratio of each of the pixel groups disposed in the second region is different from that of each of the pixel groups disposed in the first region. Each of the pixel groups of the second region includes the same number of sub-pixels as each of the pixel groups of the first region.

12 Claims, 31 Drawing Sheets

(56) References Cited

U.S. PATENT DOCUMENTS

| | | | |
|---|---|---|---|
| 2020/0227488 A1* | 7/2020 | Xin | H10K 59/00 |
| 2020/0258953 A1 | 8/2020 | Bae et al. | |
| 2020/0312832 A1 | 10/2020 | Chi et al. | |
| 2021/0159286 A1* | 5/2021 | Ma | H01L 27/3218 |
| 2021/0202621 A1* | 7/2021 | Liang | H01L 27/3262 |
| 2021/0225292 A1* | 7/2021 | Park | H10K 59/124 |
| 2021/0398481 A1* | 12/2021 | Haas | H10K 59/352 |
| 2021/0408161 A1* | 12/2021 | Sui | H01L 27/3216 |
| 2021/0408182 A1 | 12/2021 | Chung et al. | |
| 2022/0102461 A1* | 3/2022 | Yuan | H01L 27/3262 |

OTHER PUBLICATIONS

Korean Intellectual Property Office, Office Action, Korean Patent Application No. 10-2020-0135389, Mar. 30, 2024, 16 pages.

* cited by examiner

FIG. 3
DA
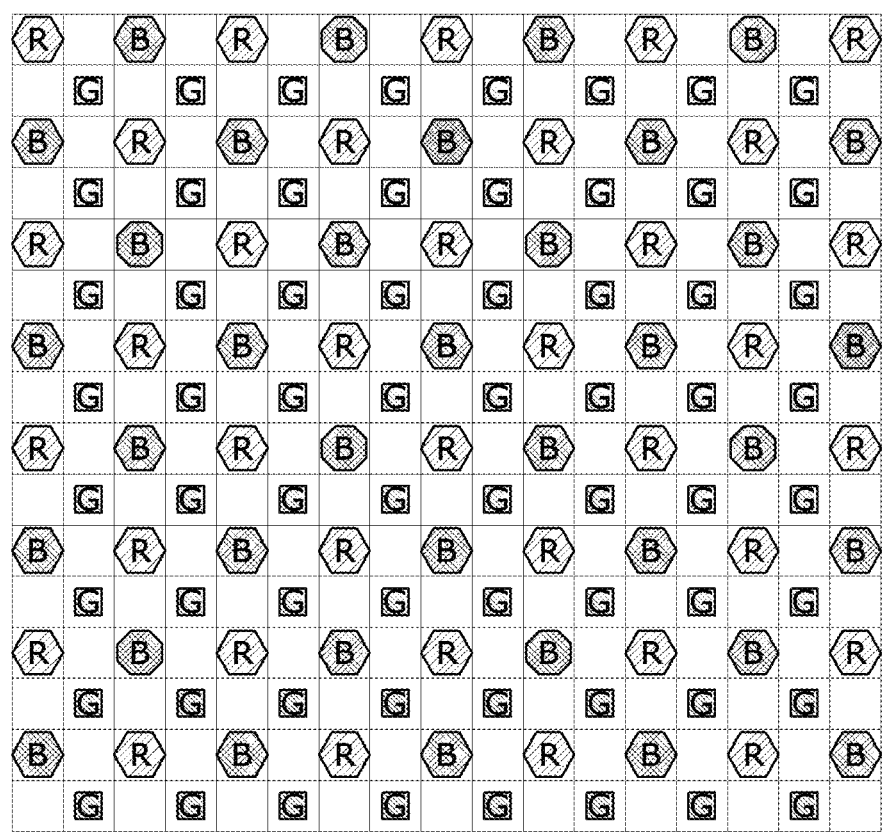
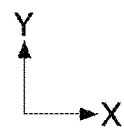
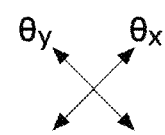

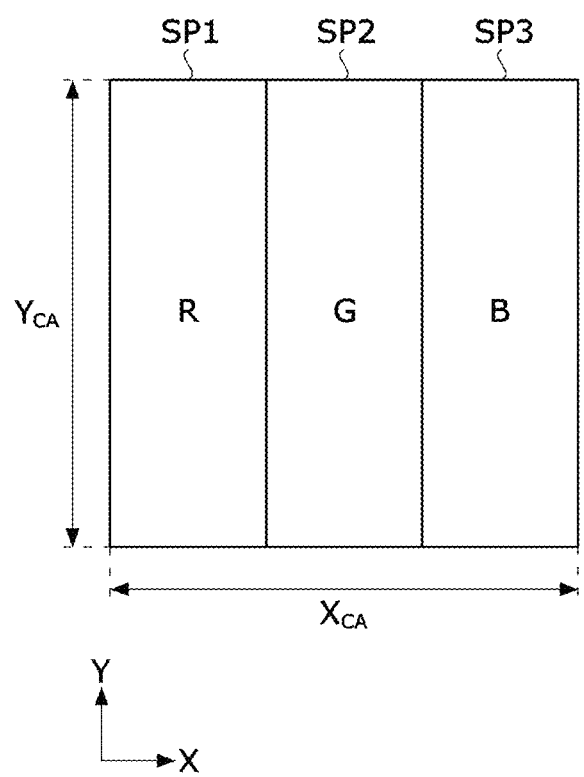

DISPLAY PANEL AND DISPLAY DEVICE USING THE SAME

CROSS-REFERENCE TO RELATED APPLICATION

This application claims priority to and the benefit of Republic of Korea Patent Application No. 10-2020-0135389, filed on Oct. 19, 2020, the disclosure of which is hereby incorporated by reference in its entirety.

BACKGROUND

1. Technical Field

The present disclosure relates to a display panel with partially different resolutions or pixels per inch (PPI) and a display device using the same.

2. Discussion of Related Art

An electroluminescent display device is roughly classified into an inorganic light emitting display device and an organic light emitting display device according to a material of a light emitting layer. An active-matrix type organic light emitting display device includes an organic light emitting diode (hereinafter referred to as "OLED") which emits light by itself, and has an advantage of a quick response time, high luminous efficiency, high luminance, and a wide viewing angle. In the organic light emitting display device, the OLED is formed in each of the pixels. Since the organic light emitting display device has a quick response time, excellent luminous efficiency, luminance, and viewing angle, but can also express a black grayscale as perfect black, contrast ratio and color gamut are excellent.

The multimedia functions of mobile terminals are improving. For example, a camera is built into a smart phone by default, and the resolution of the camera is increasing to a level of a conventional digital camera. A front camera of the smart phone restricts a screen design, making it difficult to design a screen. In order to reduce a space occupied by the camera, the screen design including a notch or punch hole has been adopted in the smart phone, but since a screen size is still limited due to the camera, a full-screen display cannot be implemented.

SUMMARY

In order to implement a full-screen display, a camera module may be disposed to overlap a screen of a display panel. In order to increase the quality of an image imaged by the camera module, transmittance of the display panel overlapping the camera module should be increased, but it is difficult to design for improving the transmittance due to pixel circuits and lines.

The present disclosure is directed to solving the above-described necessities and/or problems.

The present disclosure is directed to providing a display panel capable of implementing a full-screen display, increasing the transmittance of the display panel in a sensing region where light is received, and improving the quality of an image imaged through the sensing region, and a display device using the same.

It should be noted that objects of the present disclosure are not limited to the above-described objects, and other objects of the present disclosure will be apparent to those skilled in the art from the following descriptions.

According to an aspect of the present disclosure, there is provided a display panel including a first region where a plurality of pixel groups are disposed; and a second region where a plurality of pixel groups and a plurality of light transmitting parts are disposed, The plurality of pixel groups disposed in the second region are disposed between the light transmitting parts. An aspect ratio of each of the pixel groups disposed in the second region is set to be different from that of each of the pixel groups disposed in the first region. Each of the pixel groups of the second region includes the same number of sub-pixels as each of the pixel groups of the first region.

According to another aspect of the present disclosure, there is provided a display device including a display panel including a first region where a plurality of pixel groups are disposed, and a second region where a plurality of pixel groups and a plurality of light transmitting parts are disposed, one or more sensor modules disposed under the second region of the display panel to photoelectrically convert light received through the second region, and a display panel driving part configured to write pixel data to the pixels of the pixel groups disposed in the first and second regions.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 3 is a view illustrating the pixel disposition of a first region according to an embodiment of the present disclosure;

FIGS. 10A to 10F are views illustrating various disposition shapes of the sub-pixels in the pixel group disposed in the second region according to an embodiment of the present disclosure;

DETAILED DESCRIPTION

Figure 1:
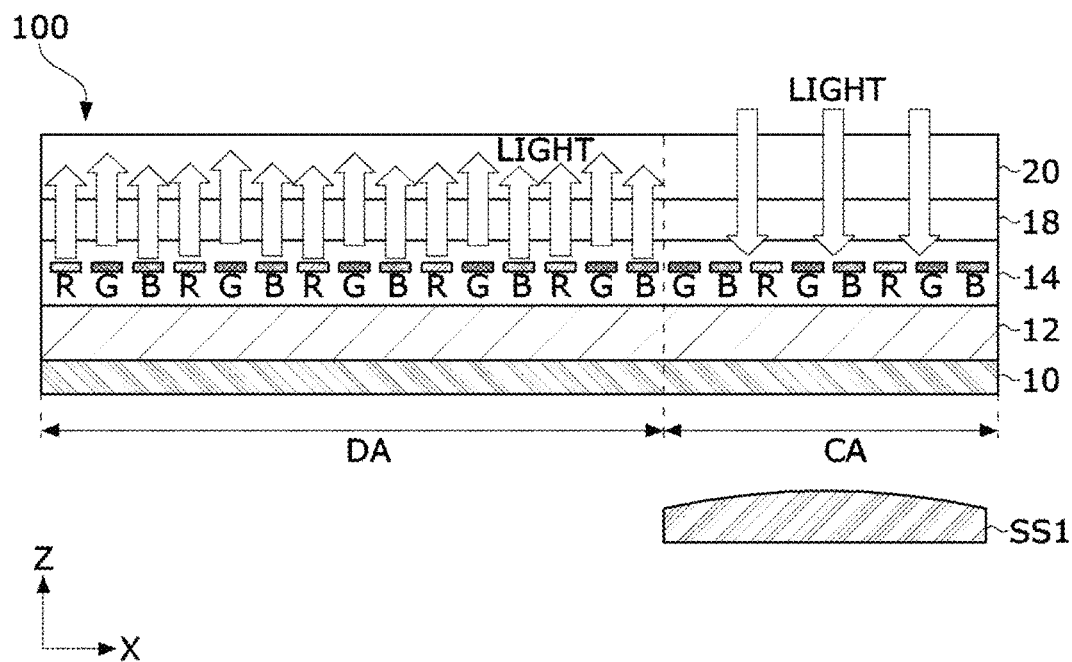
FIG. 1 is a cross-sectional view schematically illustrating a display panel according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals refer to the same elements throughout the description.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Figure 2:
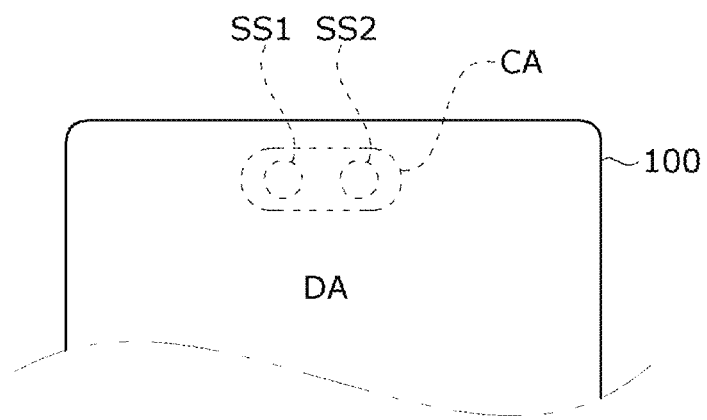
FIG. 2 is a plan view illustrating a region in a screen of the display panel where a sensor module is disposed according to an embodiment of the present disclosure.

Referring to FIGS. 1 and 2, a display panel 100 includes a screen which reproduces an input image. The screen may be divided into first and second regions DA and CA having different resolutions or pixels per inch (PPI).

Each of the first region DA and the second region CA includes a pixel array where pixels to which pixel data of an input image is written are disposed. The first region DA is a main display region which occupies most of the screen. The second region CA includes a sensing region where the pixels are disposed with a lower pixels per inch (PPI) compared to the first region DA.

As shown in FIG. 2, one or more sensor modules SS1 and SS2 facing the second region CA may be disposed under a back surface of the display panel 100. For example, an imaging module (or camera module) including an image sensor, an infrared sensor module, an illuminance sensor module, and the like may be disposed under the second region CA of the display panel 100. The sensor modules SS1 and SS2 photoelectrically convert light received through the second region CA to output an electrical signal. The second region CA may include light transmitting parts disposed at a portion secured by lowering the PPI in order to increase transmittance of light directed to the sensor modules SS1 and SS2.

Since the first region DA and the second region CA include pixels, the input image may be displayed in the first region DA and the second region CA.

Each of the pixels of the first region DA and the second region CA includes sub-pixels having different colors to realize a color of an image. The sub-pixels include a red sub-pixel (hereinafter, referred to as "an R sub-pixel"), a green sub-pixel (hereinafter, referred to as "a G sub-pixel"), and a blue sub-pixel (hereinafter, referred to as "a B sub-pixel"). Although not shown, each of pixels P (see FIG. 17) may further include a white sub-pixel (hereinafter, referred to as "a W sub-pixel"). Each of the sub-pixels may include a pixel circuit which drives a light emitting element.

An image quality compensation algorithm for compensating luminance and color coordinates of the pixels in the second region CA having a lower PPI compared to the first region DA may be applied.

In the display device of the present disclosure, since the pixels are disposed in the second region CA where a sensor is disposed, the size of the display region of the screen is not limited due to the sensor module. Accordingly, the display device of the present disclosure may implement a screen of a full-screen display.

The display panel 100 has a width in an X-axis direction, a length in a Y-axis direction, and a thickness in a Z-axis direction. The display panel 100 may include a circuit layer 12 disposed on a substrate 10, and a light emitting element layer 14 disposed on the circuit layer 12. A polarizing plate 18 may be disposed on the light emitting element layer 14, and a cover glass 20 may be disposed on the polarizing plate 18.

The circuit layer 12 may include a pixel circuit connected to lines such as data lines, gate lines, power lines, and the like and a gate driving part connected to the gate lines. The circuit layer 12 may include circuit elements such as transistors implemented with thin film transistors (TFT), a capacitor, and the like. The lines and circuit elements of the circuit layer 12 may be implemented with a plurality of insulating layers, two or more metal layers spaced apart from each other with an insulating layer therebetween, and an active layer including a semiconductor material.

The light emitting element layer 14 may include a light emitting element driven by the pixel circuit. The light emitting element may be implemented with an organic light emitting diode (OLED). The OLED includes an organic compound layer formed between an anode and a cathode. The organic compound layer may include a hole injection layer (HIL), a hole transport layer (HTL), an emission layer (EML), an electron transport layer (ETL), and an electron injection layer (EIL), but the present disclosure is not limited thereto. When a voltage is applied to the anode and the cathode of the OLED, holes passing through the hole transport layer (HTL) and electrons passing through the electron transport layer (ETL) move to the emission layer (EML) and then form excitons, and thus visible light is emitted from the emission layer (EML). The light emitting element layer 14 may be disposed on pixels which selectively transmit red, green, and blue wavelengths, and may further include a color filter array.

The light emitting element layer 14 may be covered by a protective film, and the protective film may be covered by an encapsulation layer. A protective film and the encapsulation layer may have a structure in which organic films and inorganic films are alternately stacked. The inorganic film blocks the penetration of moisture or oxygen. The organic film flattens the surface of the inorganic film. When the organic films and the inorganic films are stacked in multiple layers, since a passage for moisture or oxygen is longer than that of a single layer, the penetration of moisture or oxygen which affects the light emitting element layer 14 may be effectively blocked.

The polarizing plate 18 may be attached to the encapsulation layer. The polarizing plate 18 improves outdoor visibility of the display device. The polarizing plate 18 reduces light reflected from a surface of the display panel 100 and blocks light reflected from the metal of the circuit layer 12 to improve the brightness of pixels. The polarizing plate 18 may be implemented with a circular polarizing plate or a polarizing plate in which a linear polarizing plate and a phase retardation film are bonded.

Figure 4:
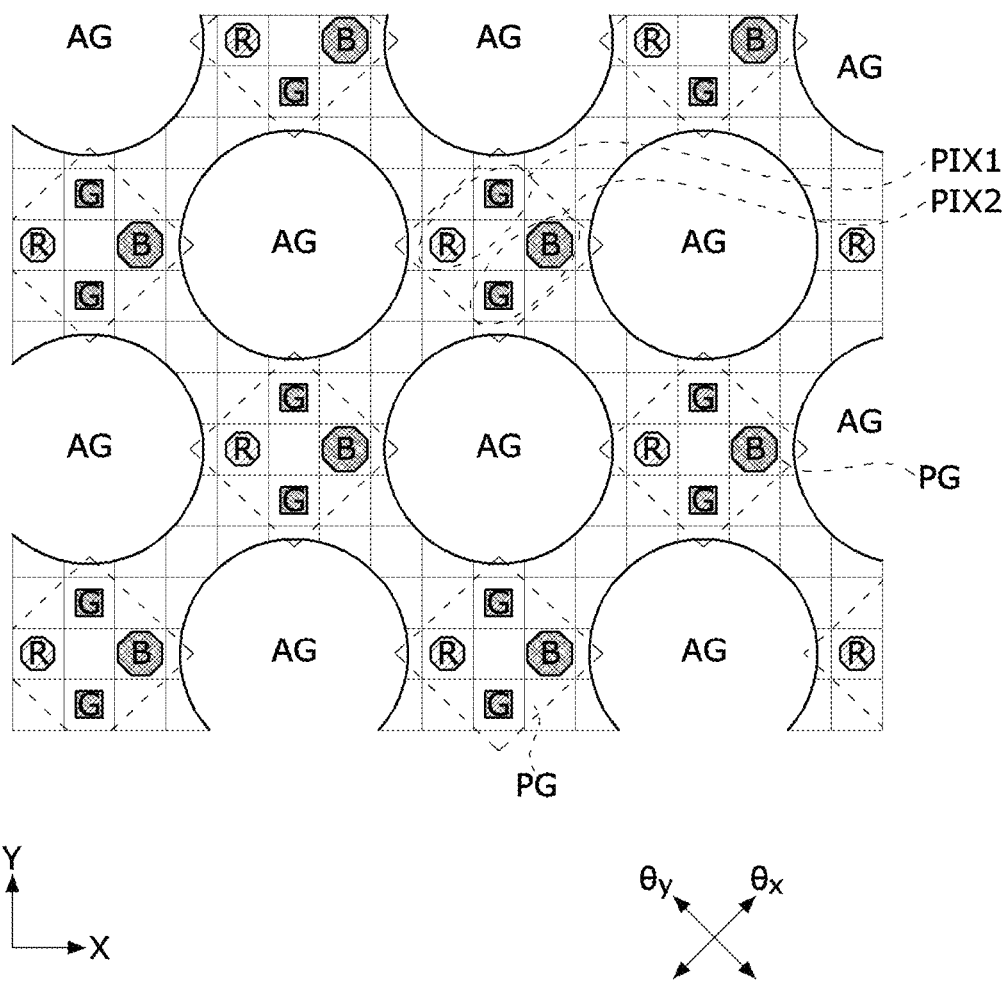
FIG. 4 is a view illustrating the pixel disposition of a second region according to an embodiment of the present disclosure.

FIG. 3 is a view illustrating an example of the pixels disposed in the first region DA. FIG. 4 is a view illustrating an example of the pixels and the light transmitting parts of the second region CA. Lines connected to the pixels are omitted in FIGS. 3 and 4.

Referring to FIG. 3, the first region DA includes pixels arranged with a high PPI. Each of the pixels may include R, G, and B sub-pixels or sub-pixels of two colors. Each of the pixels may further include a W sub-pixel omitted in the drawing.

The sub-pixels may have a different luminous efficiency of the light emitting element for each color. In consideration of this, sizes of the sub-pixels may vary for each color. For example, the B sub-pixel may be the largest and the G sub-pixel may be the smallest among the R, G, and B sub-pixels.

The pixels repeat in a first direction (X axis), a second direction (Y axis) perpendicular to the first direction, and inclination angle directions (θx and θy axes) between the first and second directions. θx and θy respectively represent inclined axis directions in which the X-axis and Y-axis are rotated by 45°.

Referring to FIG. 4, the pixels of the second region CA includes a plurality of pixel groups PG grouped by one or two pixels. The pixel groups PG are spaced from each other by a predetermined distance. Light transmitting parts AG are disposed in spaces between the pixel groups PG. The light transmitting parts AG may include transparent media having high transmittance without metal so that light may be incident with minimal light loss. In other words, the light transmitting parts AG may be formed of transparent insulating materials without including metal lines or pixels. Since the light transmitting parts AG are disposed between the pixel groups PG, the PPI of the second region CA becomes lower than that of the first region DA.

Each of the pixel groups PG may include one or two pixels, or may include three or four sub-pixels R, G, and B. Further, each of the pixel groups PG may further include one or more W sub-pixels.

As shown in FIG. 4, each pixel group PG disposed in the second region CA may include four sub-pixels. The pixel group PG may include two pixels PIX1 and PIX2. A first pixel PIX1 may be composed of the R and G sub-pixels, and a second pixel PIX2 may be composed of the B and G sub-pixels, but the present disclosure is not limited thereto. Insufficient color representation in each of the first and second pixels PIX1 and PIX2 may be compensated by an average value of corresponding color data between neighboring pixels using a sub-pixel rendering algorithm. A white color may be expressed by combining the R, G, and B sub-pixels of the first and second pixels PIX1 and PIX2.

The light transmitting parts AG may have various shapes, but may have a circular or oval shape capable of obtaining an imaged image with a reduced flare phenomenon and increasing transmittance. The pixel group PG may be designed in a rhombus or square shape to enlarge the light transmitting parts AG having a circular shape or an oval shape close to the circular shape.

As shown in FIG. 1, each of the pixel groups PG includes the circuit layer 12 on which the pixel circuit of each of the sub-pixels is disposed, and the light emitting element layer 14 connected to the circuit layer 12. The circuit layer 12 and the light emitting element layer 14 may at least partially overlap each other or may be spatially separated. The circuit layer 12 of the pixel group PG may be disposed in a rhombus or square shape.

Figure 5:
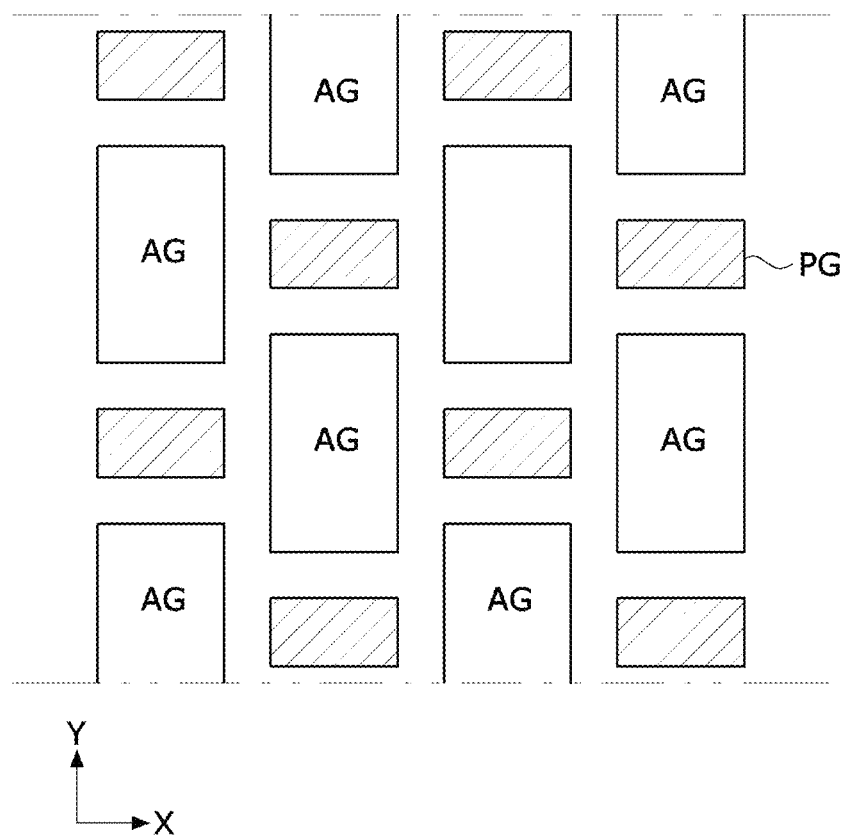
FIGS. 5 to 7 are views illustrating various embodiments of the second region.
Figure 6:
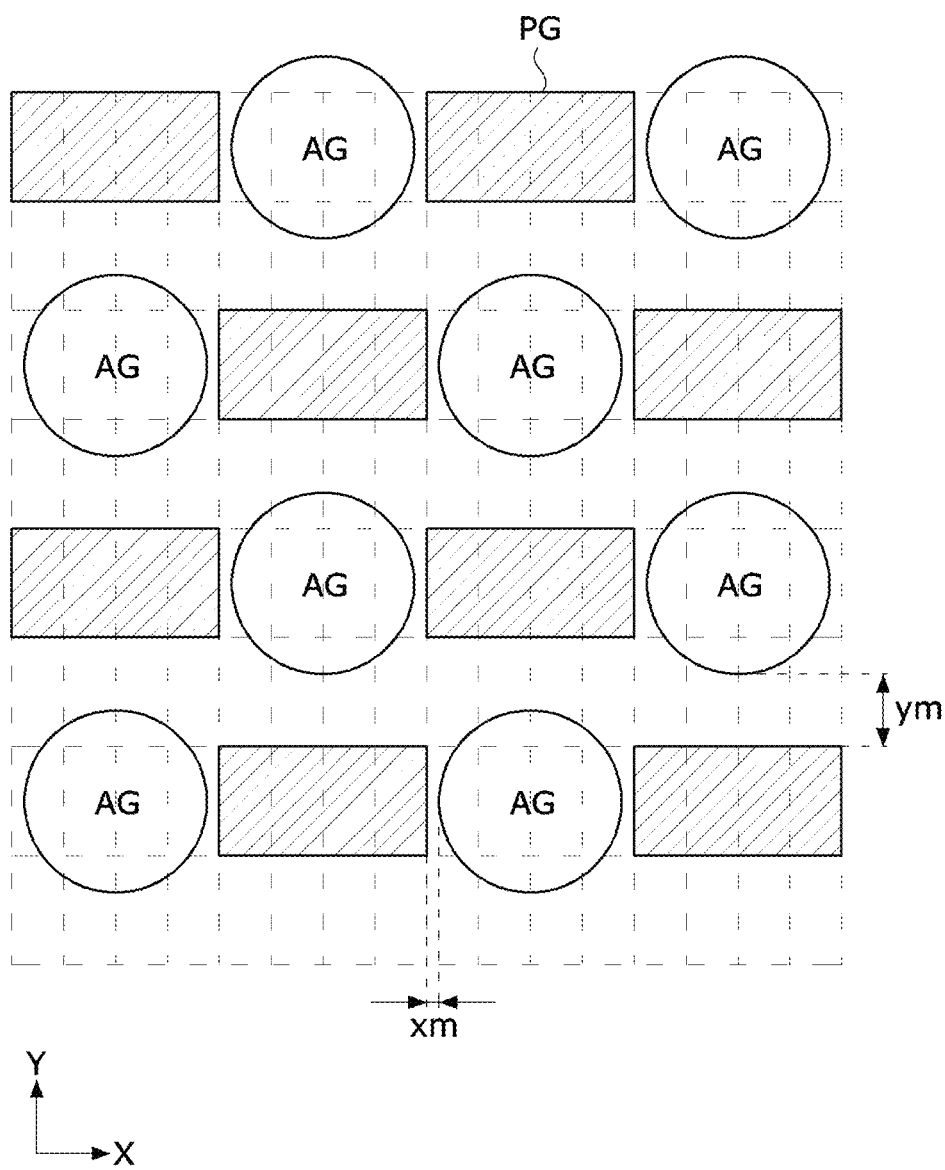
Figure 7:
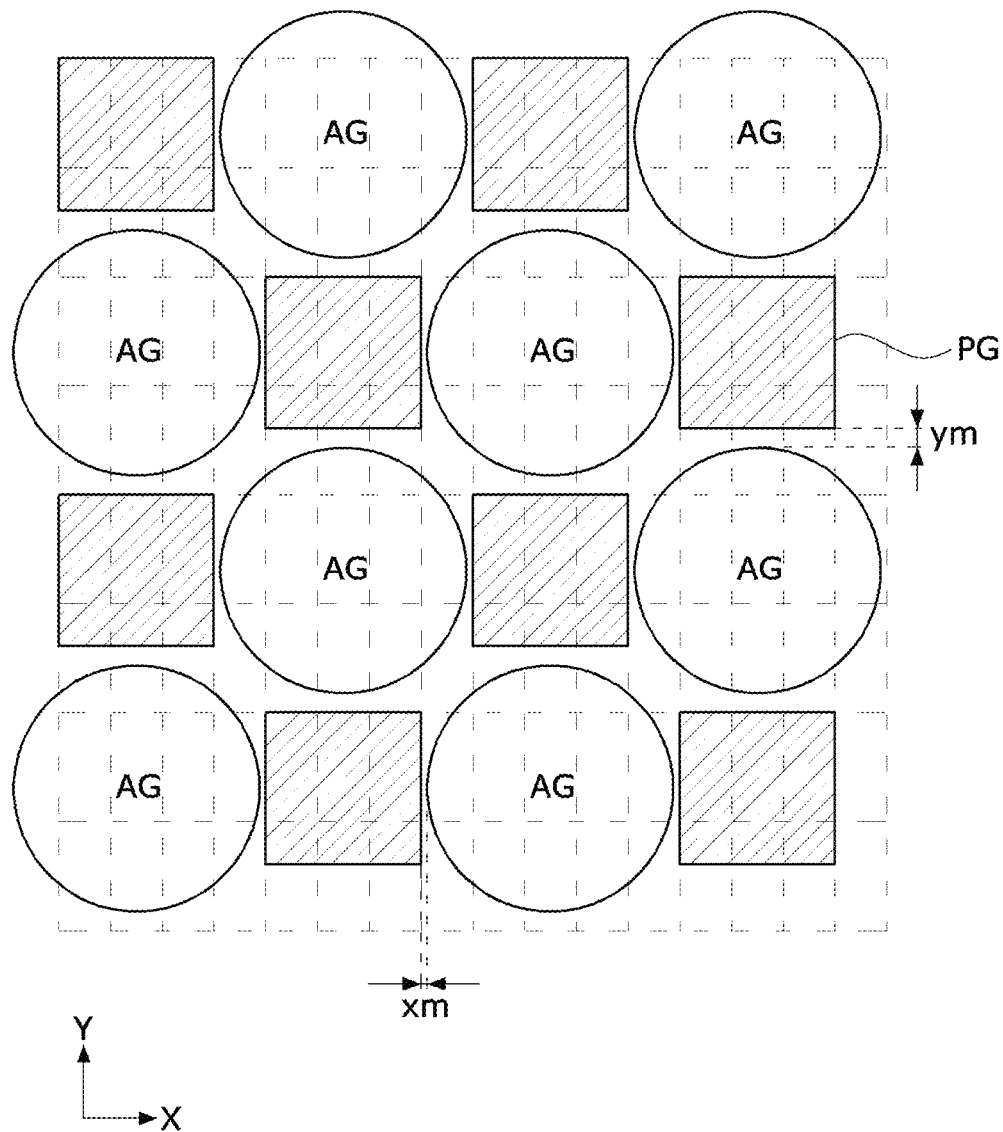

FIGS. 5 to 7 are views illustrating various embodiments of the second region CA according to one embodiment.

Referring to FIG. 5, the second region CA includes rectangular pixel groups PG and rectangular light transmitting parts AG spaced apart from each other with the pixel group PG interposed therebetween. The rectangular light transmitting parts AG may be designed to be large, but the flare phenomenon and a lattice pattern may be strongly seen in an imaged image.

Referring to FIG. 6, the second region CA includes rectangular pixel groups PG and circular light transmitting parts AG spaced apart from each other with the pixel group PG interposed therebetween.

Since the rectangular pixel group PG limits the size of the circular light transmitting part AG, it is difficult to increase the transmittance of the second region CA. When the size of each of the circular light transmitting parts AG is small, not only the transmittance of the second region CA may decrease, but also the flare phenomenon may be seen in the imaged image.

In FIG. 6, the size of each of the sub-pixels R, G, and B disposed in the pixel group PG of the second region CA and an aspect ratio of X:Y (a ratio of horizontal (X):vertical (Y)) are set to be the same as those of the sub-pixel of the first region DA. The aspect ratio of this sub-pixel is approximately 1:2. Accordingly, when four sub-pixels of the pixel group PG are disposed in parallel in the X-axis direction, the aspect ratio of the pixel group PG is approximately 2:1.

In the example of FIG. 6, due to the rectangular pixel group PG, since it is difficult to secure a minimum X-axis margin (xm) between the pixel group PG and the light transmitting part AG, in order to secure the minimum X-axis margin (xm), the size of the circular light transmitting part AG is limited. On the other hand, a Y-axis margin (ym) is free. The light transmitting part AG may be designed to have a large oval shape in the Y-axis direction, but in this case, the flare phenomenon may be strongly seen in the imaged image.

Referring to FIG. 7, the second region CA includes square or rhombus pixel groups PG and circular light transmitting parts AG spaced apart from each other with the pixel group PG interposed therebetween. When the large circular light transmitting parts AG are disposed in a zigzag shape in the first direction (X axis) and the second direction (Y axis), since the flare phenomenon and the lattice pattern in the imaged image are reduced, the quality of the imaged image obtained from the sensor module may be improved.

In FIG. 7, the size of each of the sub-pixels R, G, and B disposed in the pixel group PG of the second region CA may be set to be the same as that of each of the sub-pixels of the first region DA. The aspect ratio of X:Y of each of the sub-pixels R, G, and B disposed in the pixel group PG of the second region CA may be set to be different from the sub-pixels of the first region DA. For example, the aspect ratio of each of the sub-pixels disposed in the first region DA may be set to approximately 1:2, and the aspect ratio of each of the sub-pixels disposed in the second region CA may be set to approximately 1:4. Accordingly, when four sub-pixels of the pixel group PG are disposed in parallel in the X-axis direction, the aspect ratio of the pixel group PG is approximately 1:1. When the aspect ratio of the pixel group PG is 1:1, and disposition and the number of sub-pixels in the pixel group PG change, the aspect ratio of the sub-pixels changes.

The square or rhombus pixel group PG allows a space for designing the circular light transmitting part AG to be sufficiently secured while securing the minimum X-axis margin (xm) and the minimum Y-axis margin (ym) between the pixel group PG and the circular light transmitting part AG. In this embodiment, the light transmitting part AG may be enlarged and the flare phenomenon and the lattice pattern in the imaged image may be reduced while securing the minimum X-axis margin (xm) and the minimum Y-axis margin (ym) between the pixel group PG and the circular light-transmitting part AG.

Figure 8A:
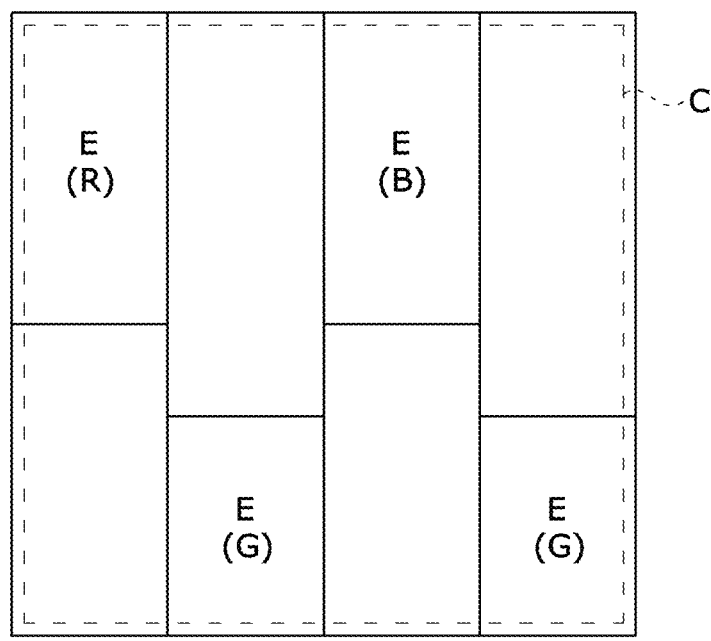
FIGS. 8A and 8B are views illustrating various examples of a light emitting region and a circuit region of a pixel group disposed in the second region.
Figure 8B:
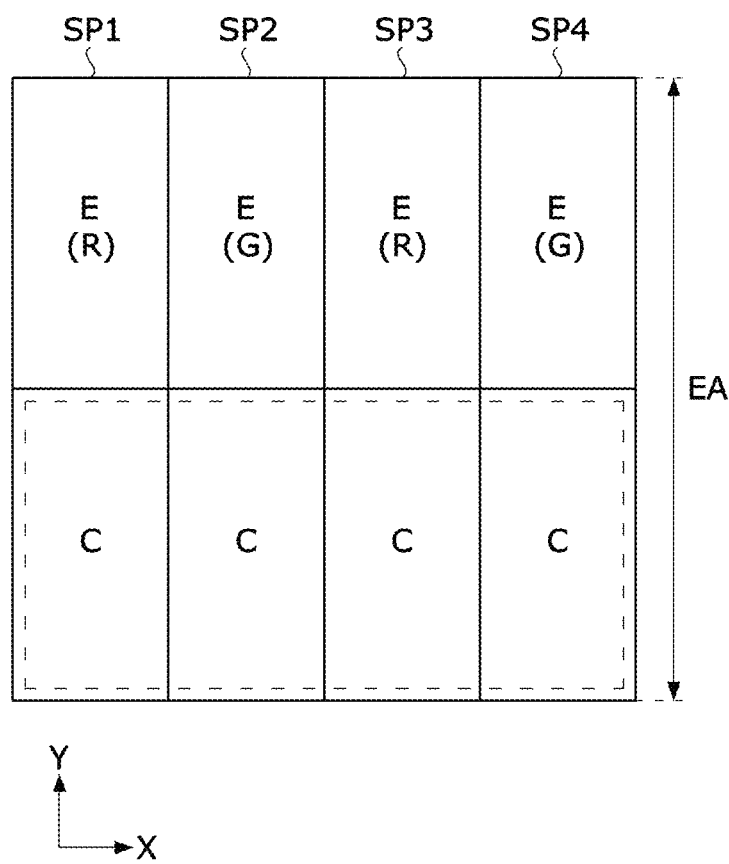

FIGS. 8A and 8B are views illustrating various examples of a light emitting region E and a circuit region of the pixel group PG disposed in the second region CA according to one embodiment.

Referring to FIGS. 8A and 8B, each of the sub-pixels R, G, and B includes a circuit region C disposed in the circuit layer 12 and a light emitting region E disposed in the light emitting element layer 14. The circuit region C and the light emitting region E may be variously designed according to an emission direction of the sub-pixel or according to an application product.

In the example of FIG. 8A, in each of the sub-pixels R, G, and B, the light emitting region E is disposed on the circuit region C, and thus the circuit region C and the light emitting region E overlap each other. In the example of FIG. 8B, in each of the sub-pixels R, G, and B, the circuit region C and the light emitting region E are spatially separated.

In the present disclosure, in order to increase the transmittance of the second region CA and improve the flare phenomenon in the imaged image by increasing the circular light transmitting parts AG disposed in the zigzag shape in the second region CA, the pixel group PG disposed in the second region CA is designed in a square shape. In the example of FIG. 8A, the circuit region C of the pixel group PG is designed in a square or rhombus shape. In the example of FIG. 8B, a combined region of the circuit region C and the light emitting region E of the pixel group PG is designed in a square or rhombus shape.

Figure 9:
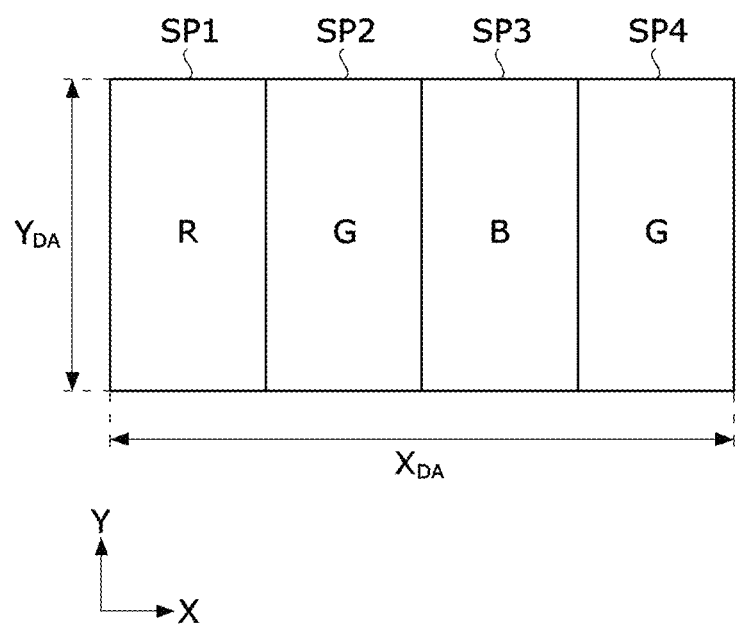
FIG. 9 is a view illustrating one example of sub-pixels disposed within the same size as the pixel group disposed in the second region according to an embodiment of the present disclosure.

FIG. 9 is a view illustrating one example of the sub-pixels disposed within the same size as the pixel group PG disposed in the second region CA according to one embodiment. FIGS. 10A to 10F are views illustrating various disposition shapes of the sub-pixels in the pixel group PG disposed in the second region CA according to one embodiment. Pixel shapes of the first region DA and the second region CA will be compared with reference to FIGS. 9 to 10F.

Referring to FIG. 9, in the first region DA, the sub-pixels may be disposed in parallel in the order of R, G, B, and G along the first direction (X-axis). The pixel group including four sub-pixels is a rectangular pixel region of which a lateral length ($X_{DA}$) is greater than a longitudinal length ($Y_{DA}$). In order to increase the resolution of the first region DA, one pixel may be composed of two sub-pixels. The one pixel may be composed of R and G sub-pixels SP1 and SP2, and the other pixel may be composed of B and G sub-pixels SP3 and SP4. In this case, the four sub-pixels SP1 to SP4 shown in FIG. 9 are divided into two pixels. Insufficient color representation in each of the two pixels is compensated by the average value of the corresponding color data between neighboring pixels using a sub-pixel rendering algorithm. The sub-pixel rendering algorithm expresses a white color which may not be expressed in one pixel with two neighboring pixels.

In each of the sub-pixels SP1 to SP4 of the first region DA, the aspect ratio may be set to 1:2. For example, when the horizontal length of the sub-pixel is 27.85 μm, the vertical length of the sub-pixel may be set to 55.7 μm. In this case, the aspect ratio of the pixel group including the four sub-pixels in the first region DA is 2:1.

Figure 10A:
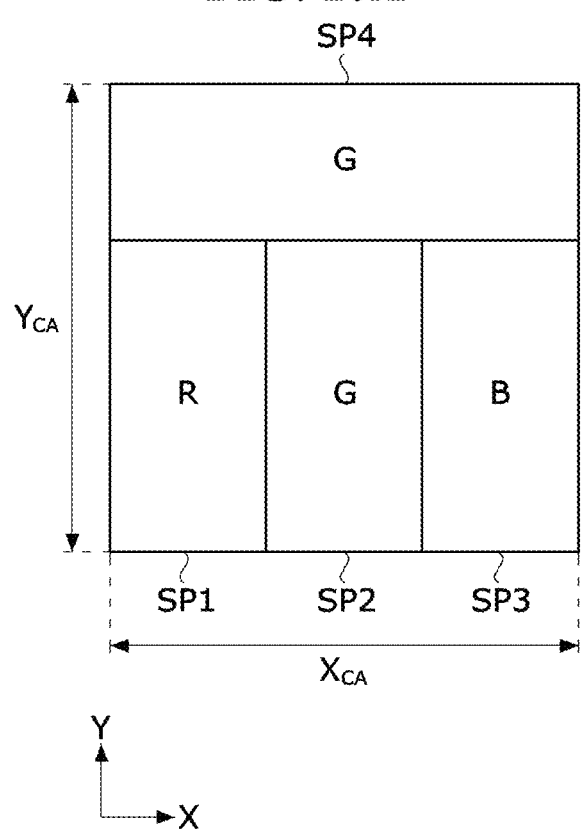

In the second region CA, the circular light transmitting parts AG are disposed in a zigzag shape in each of the first direction X and the second direction Y. In order to enlarge the circular light transmitting parts AG, the pixel group PG disposed between the circular light-transmitting parts AG is designed in the square or rhombus shape as shown in FIGS. 10A to 10F. Each pixel group PG may include one or two pixels, or may include three or four sub-pixels R, G, and B. In FIG. 10A, the first direction X may be interpreted as a lateral direction of the pixel group, and the second direction Y may be interpreted as a longitudinal direction of the pixel group. In the display panel 100 of the present disclosure, the lateral length of the pixel group PG disposed in the second region CA may be set to be the same as or different from the lateral length of the pixel group disposed in the first region. Further, the longitudinal length of the pixel group PG disposed in the second region CA may be set to be greater than the longitudinal length of the pixel group disposed in the first region DA. Here, as shown in FIGS. 9 to 10F, the pixel group PG of the second region CA includes the same number of sub-pixels as the pixel group of the first region DA.

Referring to FIG. 10A, the pixel group PG of the second region CA may include four sub-pixels SP1 to SP4. The pixel group PG may include two pixels. A first pixel may be formed of the R and G sub-pixels SP1 and SP2, and a second pixel be formed of the B and G sub-pixels SP3 and SP4. Insufficient color representation in each of the first and second pixels in the pixel group PG is compensated by the average value of the corresponding color data between neighboring pixels using a sub-pixel rendering algorithm. The sub-pixel rendering algorithm expresses a white color which may not be expressed in one pixel with two neighboring pixels.

The first to third sub-pixels SP1, SP2, and SP3 may be disposed in parallel along the first direction X. The fourth sub-pixel SP4 may be disposed on the first to third sub-pixels SP1, SP2, and SP3. The second and fourth sub-pixels SP2 and SP4 may be sub-pixels of the same color, for example, G sub-pixels. Accordingly, in the pixel group PG shown in FIG. 10A, the G sub-pixels are arranged in a T-shape.

The aspect ratio of the pixel group including the four sub-pixels SP1 to SP4 in the second region CA is 1:1, as shown in FIG. 10A. When comparing the pixel group of the second region CA and the pixel group of the first region DA, the longitudinal length ($Y_{CA}$) of the pixel group disposed in the second region CA is set to be greater than a longitudinal length ($Y_{DA}$) of the pixel group disposed in the first region DA when the number of sub-pixels in the pixel group is the same. The lateral length ($X_{CA}$) of the pixel group disposed in the second region CA may be set to be the same as or different from a lateral length ($X_{DA}$) of the pixel group disposed in the first region DA.

Figure 10B:
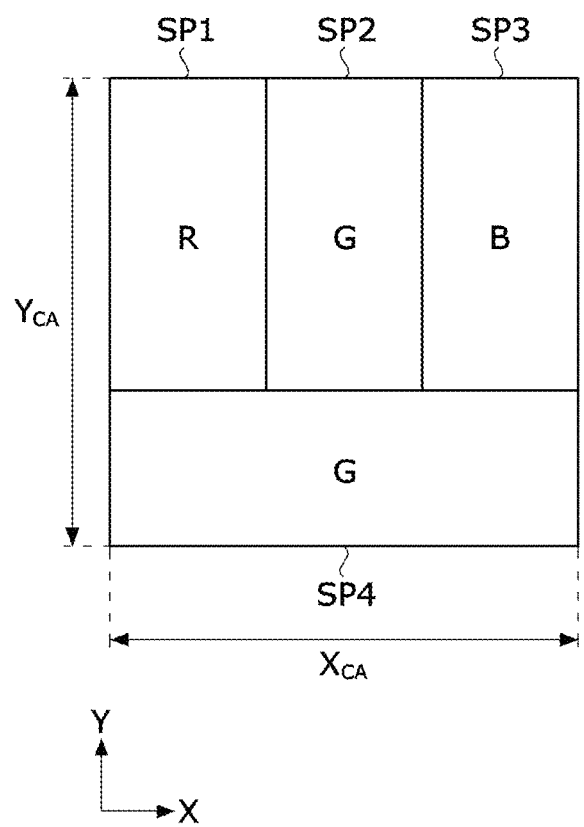

Referring to FIG. 10B, the pixel group PG of the second region CA may include four sub-pixels SP1 to SP4. The pixel group PG may include two pixels. A first pixel may be formed of the R and G sub-pixels SP1 and SP2, and a second pixel be formed of the B and G sub-pixels SP3 and SP4. Insufficient color representation in each of the first and second pixels in the pixel group PG is compensated by the average value of the corresponding color data between neighboring pixels using a sub-pixel rendering algorithm. The sub-pixel rendering algorithm expresses a white color which may not be expressed in one pixel with two neighboring pixels.

The first to third sub-pixels SP1, SP2, and SP3 may be disposed in parallel along the first direction X. The fourth sub-pixel SP4 may be disposed under the first to third sub-pixels SP1, SP2, and SP3. The second and fourth sub-pixels SP2 and SP4 may be sub-pixels of the same color, for example, G sub-pixels. Accordingly, in the pixel group PG shown in FIG. 10B, the G sub-pixels are arranged in an inverted T-shape.

The aspect ratio of the pixel group including the four sub-pixels SP1 to SP4 in the second region CA is 1:1, as shown in FIG. 10B. When comparing the pixel group of the second region CA and the pixel group of the first region DA, the longitudinal length ($Y_{CA}$) of the pixel group disposed in the second region CA is set to be greater than the longitudinal length ($Y_{DA}$) of the pixel group disposed in the first region DA when the number of sub-pixels in the pixel group is the same. The lateral length ($X_{CA}$) of the pixel group disposed in the second region CA may be set to be the same as or different from the lateral length ($X_{DA}$) of the pixel group disposed in the first region DA.

Figure 10C:
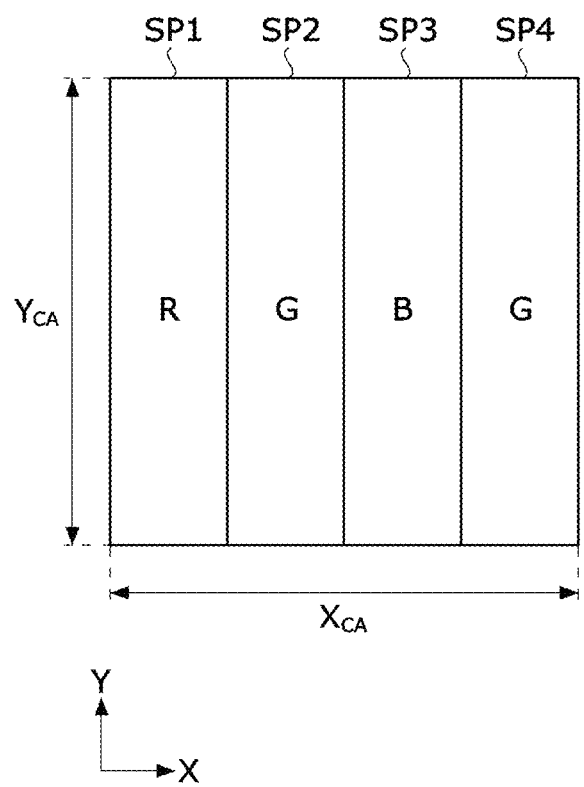

Referring to FIG. 10C, the pixel group PG of the second region CA may include four sub-pixels SP1 to SP4. The pixel group PG may include two pixels. A first pixel may be formed of the R and G sub-pixels SP1 and SP2, and a second pixel be formed of the B and G sub-pixels SP3 and SP4. Insufficient color representation in each of the first and second pixels in the pixel group PG is compensated by the average value of the corresponding color data between neighboring pixels using a sub-pixel rendering algorithm. The sub-pixel rendering algorithm expresses a white color which may not be expressed in one pixel with two neighboring pixels. The first to fourth sub-pixels SP1 to SP4 shown in FIG. 10C may be disposed in parallel along the first direction X. The aspect ratio of each of the sub-pixels SP1 to SP4 may be 1:4.

The aspect ratio of the pixel group including the four sub-pixels SP1 to SP4 in the second region CA is 1:1, as shown in FIG. 10C. When comparing the pixel group of the second region CA and the pixel group of the first region DA, the longitudinal length ($Y_{CA}$) of the pixel group disposed in the second region CA is set to be greater than the longitudinal length ($Y_{DA}$) of the pixel group disposed in the first region DA when the number of sub-pixels in the pixel group is the same. The lateral length ($X_{CA}$) of the pixel group disposed in the second region CA may be set to be the same as or different from the lateral length ($X_{DA}$) of the pixel group disposed in the first region DA.

Figure 10D:
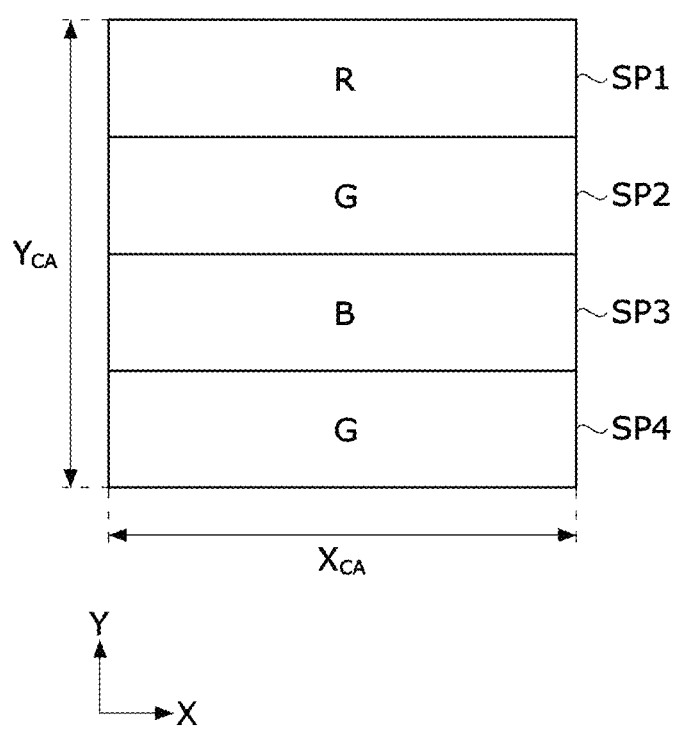

Referring to FIG. 10D, the pixel group PG of the second region CA may include four sub-pixels SP1 to SP4. The pixel group PG may include two pixels. A first pixel may be formed of the R and G sub-pixels SP1 and SP2, and a second pixel be formed of the B and G sub-pixels SP3 and SP4. Insufficient color representation in each of the first and second pixels in the pixel group PG is compensated by the average value of the corresponding color data between neighboring pixels using a sub-pixel rendering algorithm. The sub-pixel rendering algorithm expresses a white color which may not be expressed in one pixel with two neighboring pixels. The first to fourth sub-pixels SP1 to SP4 shown in FIG. 10D may be disposed in parallel along the second direction Y. The aspect ratio of each of the sub-pixels SP1 to SP4 may be 4:1.

The aspect ratio of the pixel group including the four sub-pixels SP1 to SP4 in the second region CA is 1:1, as shown in FIG. 10D. When comparing the pixel group of the second region CA and the pixel group of the first region DA, the longitudinal length ($Y_{CA}$) of the pixel group disposed in the second region CA is set to be greater than the longitudinal length ($Y_{DA}$) of the pixel group disposed in the first region DA when the number of sub-pixels in the pixel group is the same. The lateral length ($X_{CA}$) of the pixel group disposed in the second region CA may be set to be the same as or different from the lateral length ($X_{DA}$) of the pixel group disposed in the first region DA.

Figure 10E:
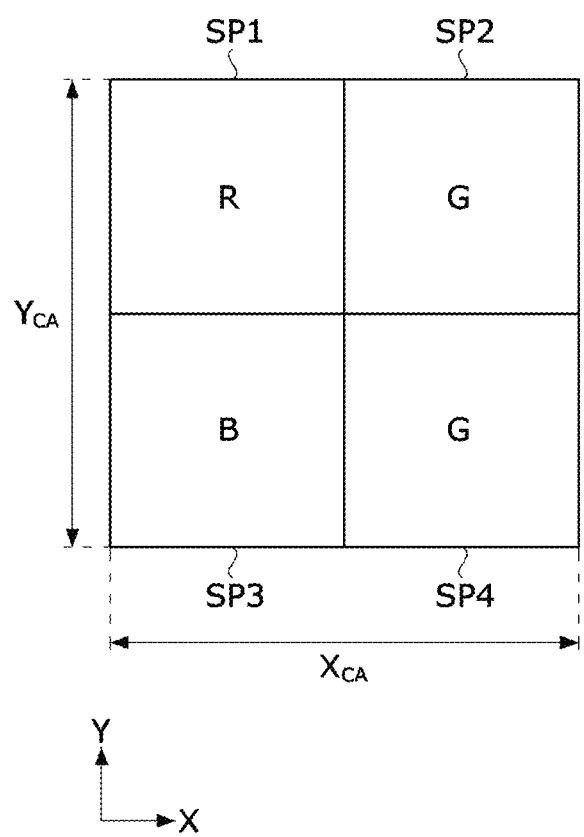

Referring to FIG. 10E, the pixel group PG of the second region CA may include four sub-pixels SP1 to SP4. The pixel group PG may include two pixels. A first pixel may be formed of the R and G sub-pixels SP1 and SP2, and a second pixel be formed of the B and G sub-pixels SP3 and SP4.

Insufficient color representation in each of the first and second pixels in the pixel group PG is compensated by the average value of the corresponding color data between neighboring pixels using a sub-pixel rendering algorithm. The sub-pixel rendering algorithm expresses a white color which may not be expressed in one pixel with two neighboring pixels. The first and second sub-pixels SP1 and SP2 may be disposed in parallel along the first direction X. The third and fourth sub-pixels SP3 and SP4 may be disposed in parallel along the first direction X under the first and second sub-pixels SP1 and SP2. The aspect ratio of each of the sub-pixels SP1 to SP4 may be 1:1.

The aspect ratio of the pixel group including the four sub-pixels SP1 to SP4 in the second region CA is 1:1, as shown in FIG. 10E. When comparing the pixel group of the second region CA and the pixel group of the first region DA, the longitudinal length ($Y_{CA}$) of the pixel group disposed in the second region CA is set to be greater than the longitudinal length ($Y_{DA}$) of the pixel group disposed in the first region DA when the number of sub-pixels in the pixel group is the same. The lateral length ($X_{CA}$) of the pixel group disposed in the second region CA may be set to be the same as or different from the lateral length ($X_{DA}$) of the pixel group disposed in the first region DA.

Referring to FIG. 10F, the pixel group PG of the second region CA may include three sub-pixels SP1 to SP3. The pixel group PG may include one pixel. The first to third sub-pixels SP1 to SP3 in the pixel group PG may be disposed in parallel along the first direction X. The aspect ratio of each of the sub-pixels SP1 to SP3 may be 1:3.

The aspect ratio of the pixel group including the three sub-pixels SP1 to SP3 in the second region CA is 1:1, as shown in FIG. 10F. When comparing the pixel group of the second region CA and the pixel group of the first region DA, the longitudinal length ($Y_{CA}$) of the pixel group disposed in the second region CA is set to be greater than the longitudinal length ($Y_{DA}$) of the pixel group disposed in the first region DA when the number of sub-pixels in the pixel group is the same as three. The lateral length ($X_{CA}$) of the pixel group disposed in the second region CA may be set to be the same as or different from the lateral length ($X_{DA}$) of the pixel group disposed in the first region DA.

Figure 11:
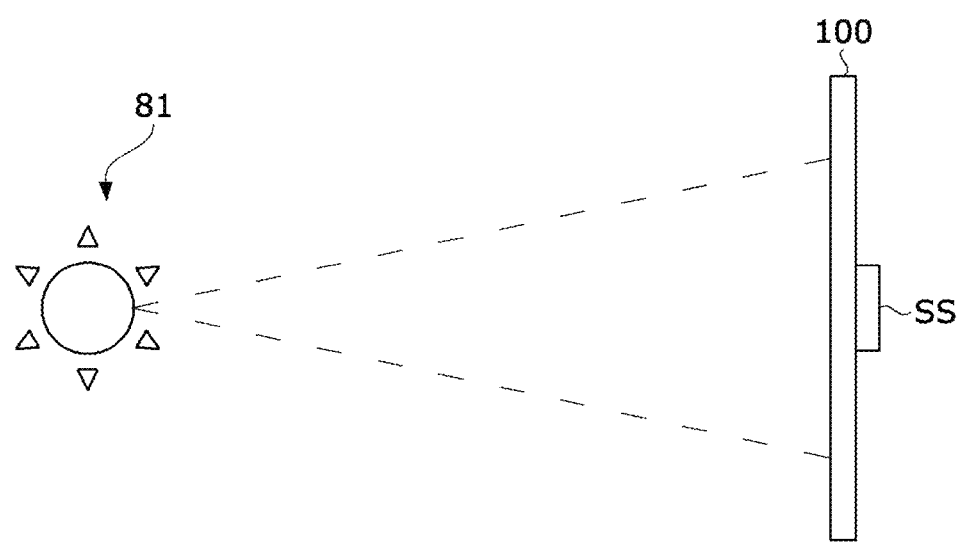
FIG. 11 is a view illustrating an experimental method in which a light source is captured through the second region with the sensor module disposed in the second region of the display panel according to an embodiment of the present disclosure according to an embodiment of the present disclosure.

The quality of the imaged image is confirmed by imaging light passing through various types of light transmitting parts in the second region CA of the display panel 100. In this experiment, as shown in FIG. 11 according to one embodiment, a light source 81, which was lit while the display panel 100 is separated from the light source 81 by a predetermined distance was captured by an imaging module SS.

Figure 12A:
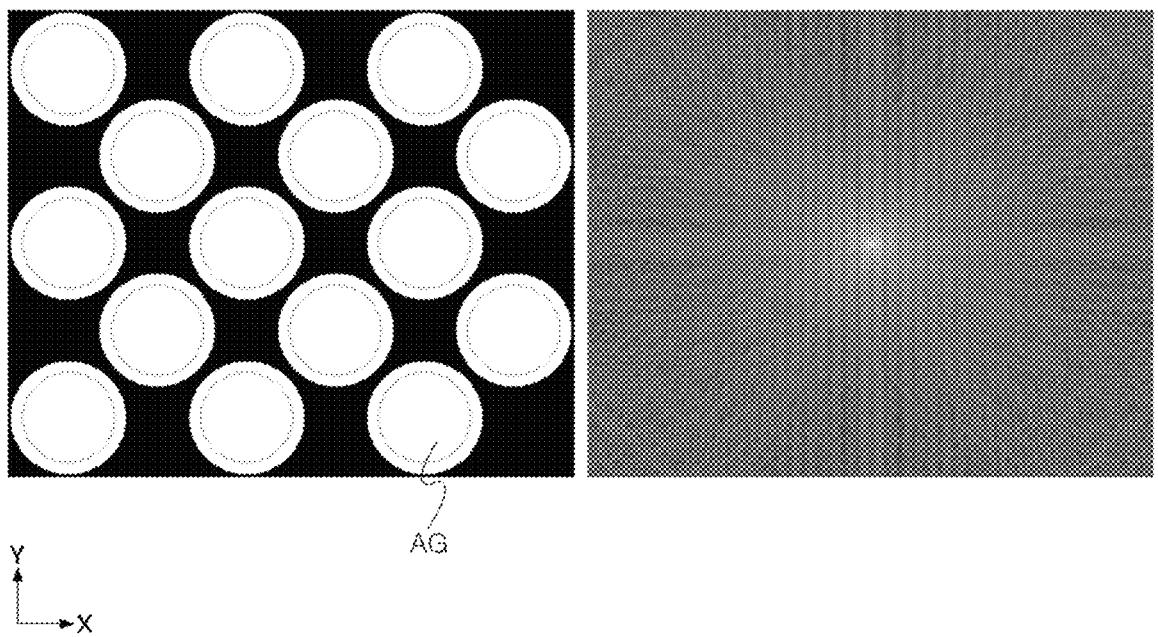
FIGS. 12A to 12C are views illustrating a light source image captured through various circular light transmitting parts.
Figure 12B:
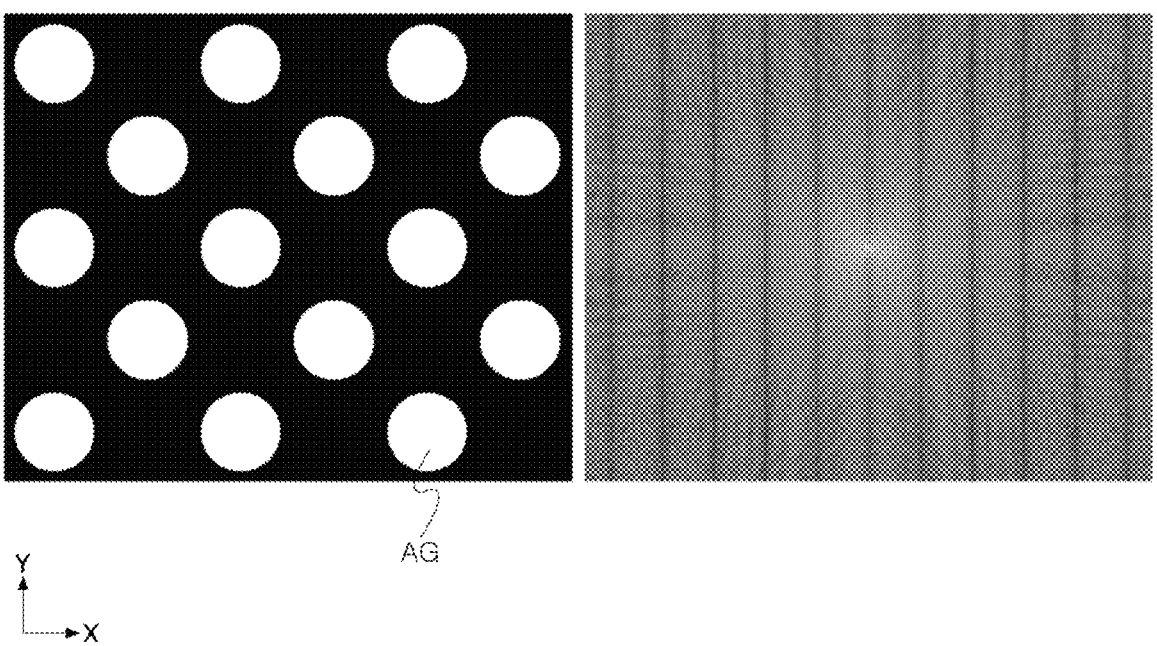
Figure 12C:
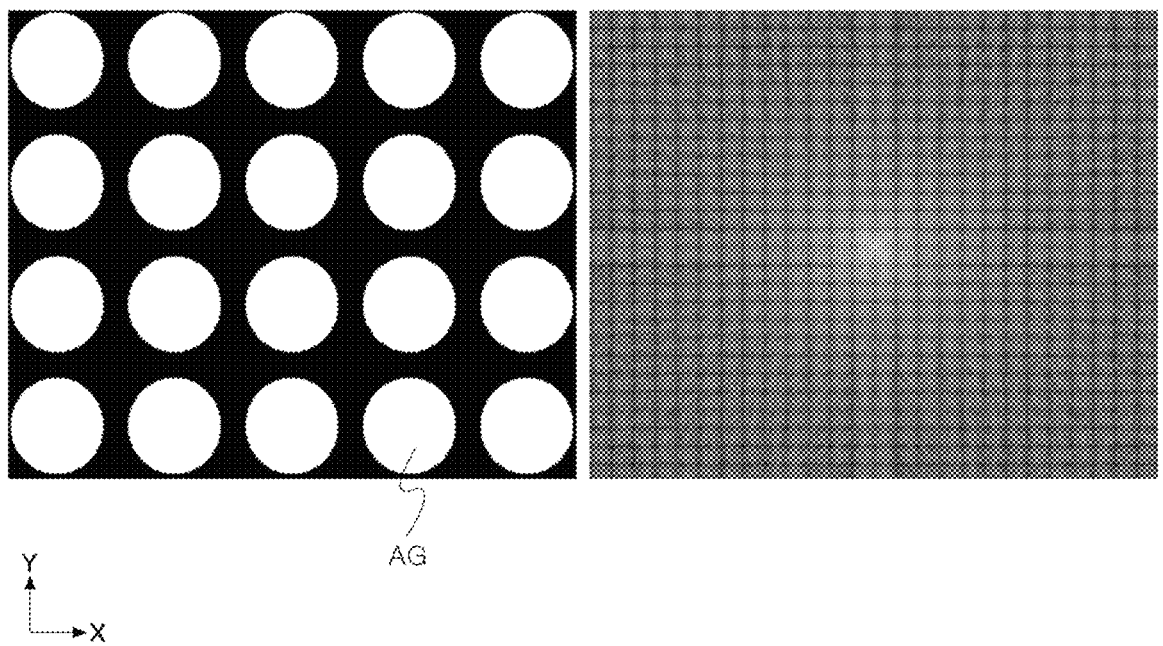

FIGS. 12A to 12C are views illustrating a light source image captured through various circular light transmitting parts. As can be seen in FIGS. 12A and 12B, when the circular light transmitting parts AG are disposed in the zigzag shape in each of the first direction (X-axis) and the second direction (Y-axis), the sizes of the light transmitting parts are large, and the gap is small, the flare phenomenon and the lattice pattern are weakly seen. However, when the circular light transmitting parts AG are disposed in a straight line in each of the first direction (X-axis) and the second direction (Y-axis), the lattice pattern is strongly seen as shown in FIG. 12C.

Figure 13:
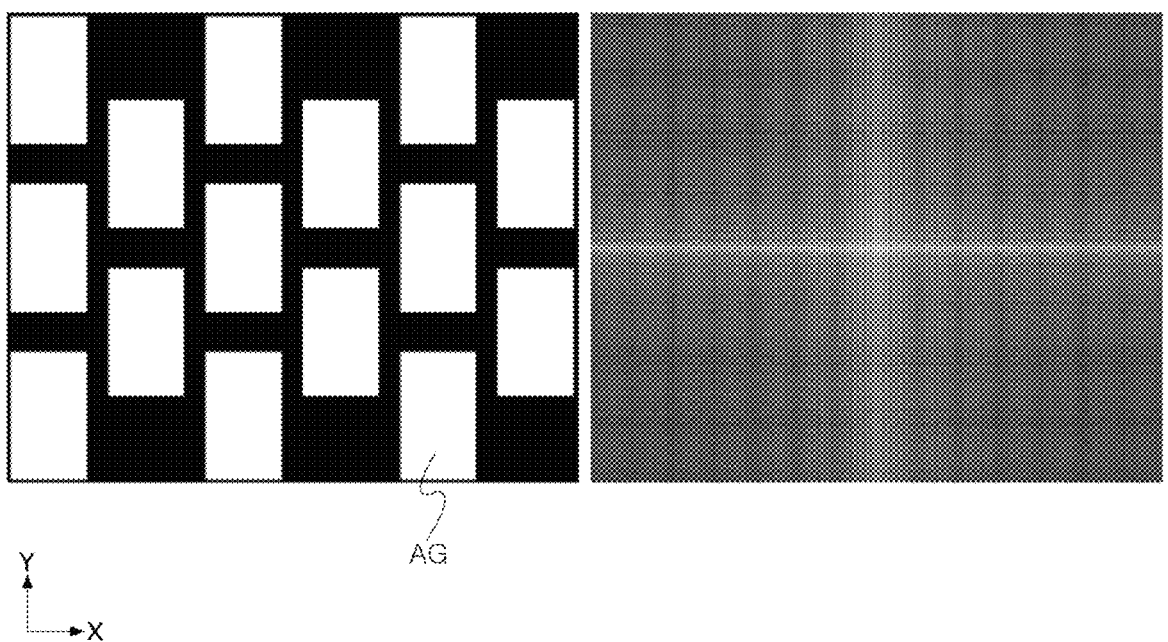
FIGS. 13 and 14 are views illustrating a light source image captured through rectangular light transmitting parts.
Figure 14:
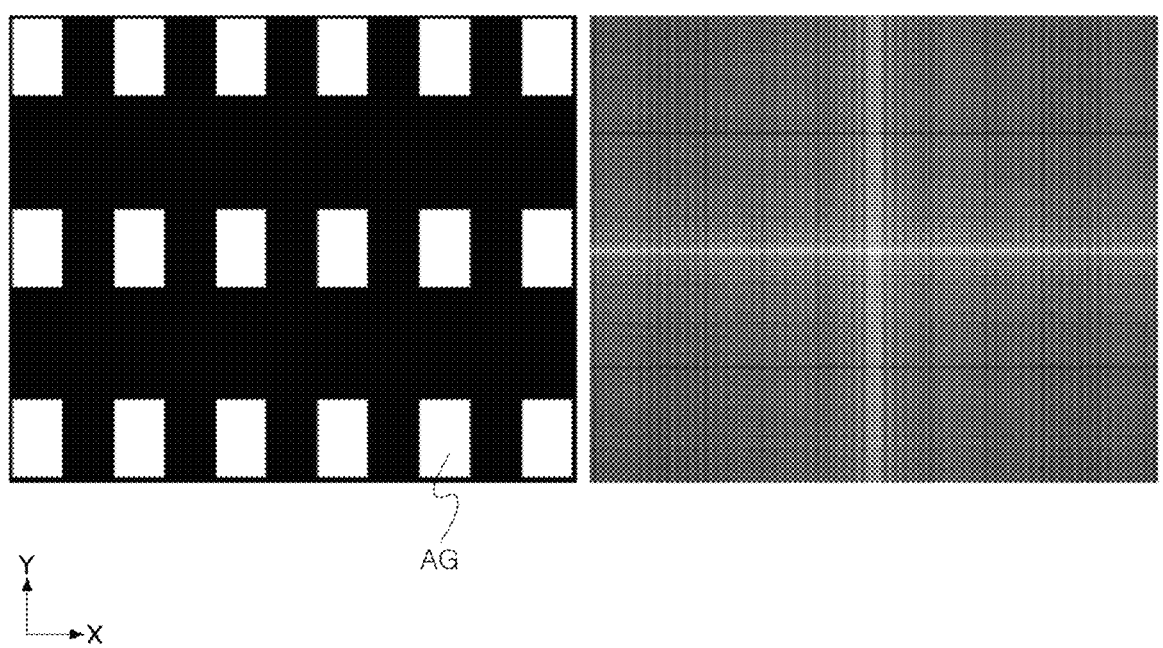
Figure 15:
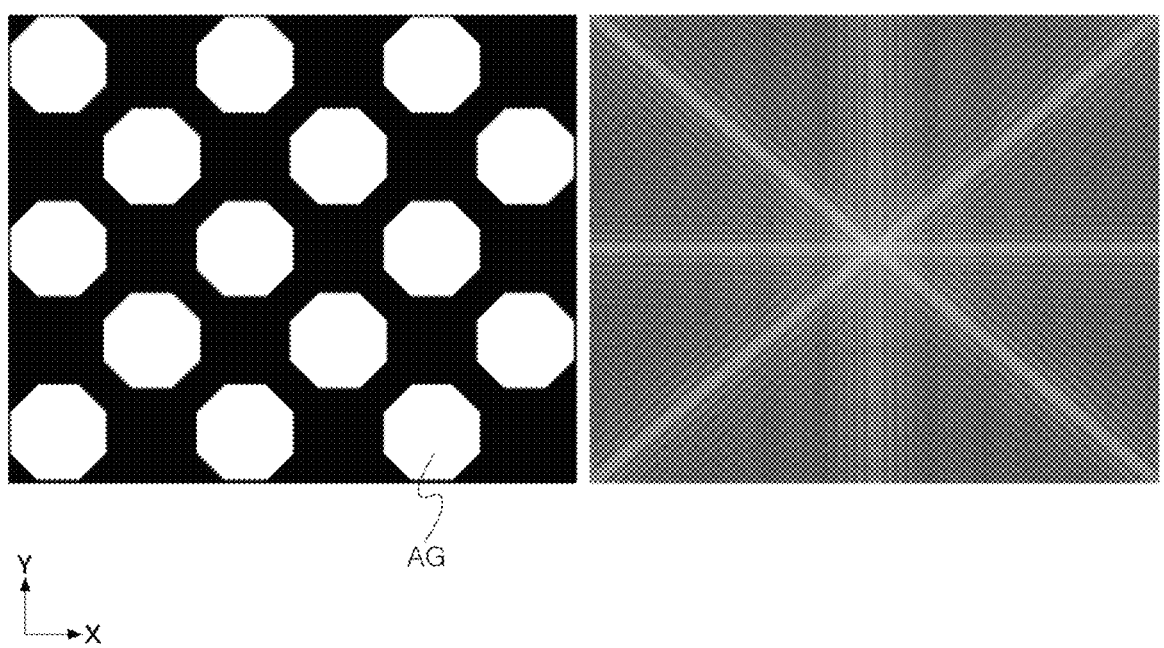
FIG. 15 is a view illustrating a light source image captured through octagonal light transmitting parts.

FIGS. 13 and 14 are views illustrating the light source image captured through rectangular light transmitting parts. FIG. 15 is a view illustrating a light source image captured through octagonal light transmitting parts. As shown in FIGS. 13 and 14, in the rectangular light transmitting parts AG, the flare phenomenon and the lattice pattern are strongly shown in the first direction (X-axis) and the second direction (Y-axis). As shown in FIG. 15, in the octagonal light-transmitting parts AG, the flare phenomenon and the lattice pattern are strongly shown in the first direction (X-axis), the second direction (Y-axis), and the inclination angle directions (θx and θy axes).

The quality of the imaged image is evaluated while adjusting a ratio of a minimum diameter and a maximum diameter of the circular light transmitting part AG. As a result, a flare improvement effect was more than a satisfactory level when the ratio of the minimum diameter and the maximum diameter was 1:1.3 or less in the oval or circular light transmitting part AG having different minimum and maximum diameters. When the ratio of the minimum diameter and the maximum diameter is greater than 1:1.3, the flare phenomenon did not reach the expected effect. In the present disclosure, since the circular or oval light transmitting parts AG each having the ratio of the minimum diameter and the maximum diameter of 1:1.3 or less are disposed in the zigzag shape in the second region CA, and the square or rhombus-shaped pixel group PG is disposed between the light transmitting parts AG and thus the light transmitting parts AG are designed as large as possible, it was possible to improve the transmittance of the second region CA and improve the quality of the imaged image captured through the second region CA.

The lateral length and the longitudinal length of the pixel group PG may be changed according to the diameter ratio of the oval light transmitting part AG of 1:1.3. For example, when the maximum diameter of the oval light transmitting part AG is a diameter in the first direction X and the minimum diameter is a diameter in the second direction Y, in the pixel group PG, the length ($X_{CA}$) in the first direction may be designed to be 1.3 or less times larger than the length ($Y_{CA}$) in the second direction. When the maximum diameter of the oval light transmitting part AG is a diameter in the second direction Y and the minimum diameter is a diameter in the first direction X, in the pixel group PG, the length ($Y_{CA}$) in the second direction may be designed to be 1.3 or less times larger than the length ($X_{CA}$) in the first direction. In this case, the pixel group PG is a pixel region having a quadrangular shape close to a square shape or a rhombus shape. Accordingly, in each of the pixel groups PG disposed in the second region CA, a length of the oval light transmitting part AG in the maximum radial direction may be set to be 1.3 or less times larger than a length of the oval light transmitting part AG in the minimum radial direction.

All metal electrode materials are removed from the light transmitting parts AG. A metal used as the cathode of the light emitting element OLED is uniformly deposited on an entire screen, and is removed from the light transmitting part AG by a laser ablation process. In the laser ablation process, a cathode layer within the light transmitting part AG of the second region CA may be removed. In the laser ablation process, the cathode layer may be melted and removed by irradiating a laser beam to the cathode layer. The wavelength of the laser beam applied in the laser ablation process is selected as a wavelength having a high absorption coefficient for a cathode material. In the present disclosure, as shown in FIG. 16, since a light shield layer which exposes the light transmitting part AG is formed on the display panel 100, and a laser beam larger than the light transmitting part AG is irradiated to the display panel 100 in the laser ablation process, the circular or oval light transmitting part AG may be formed to be large in the narrow X-axis margin (xm) and the narrow Y-axis margin (ym) illustrated in FIG. 7.

Figure 16:
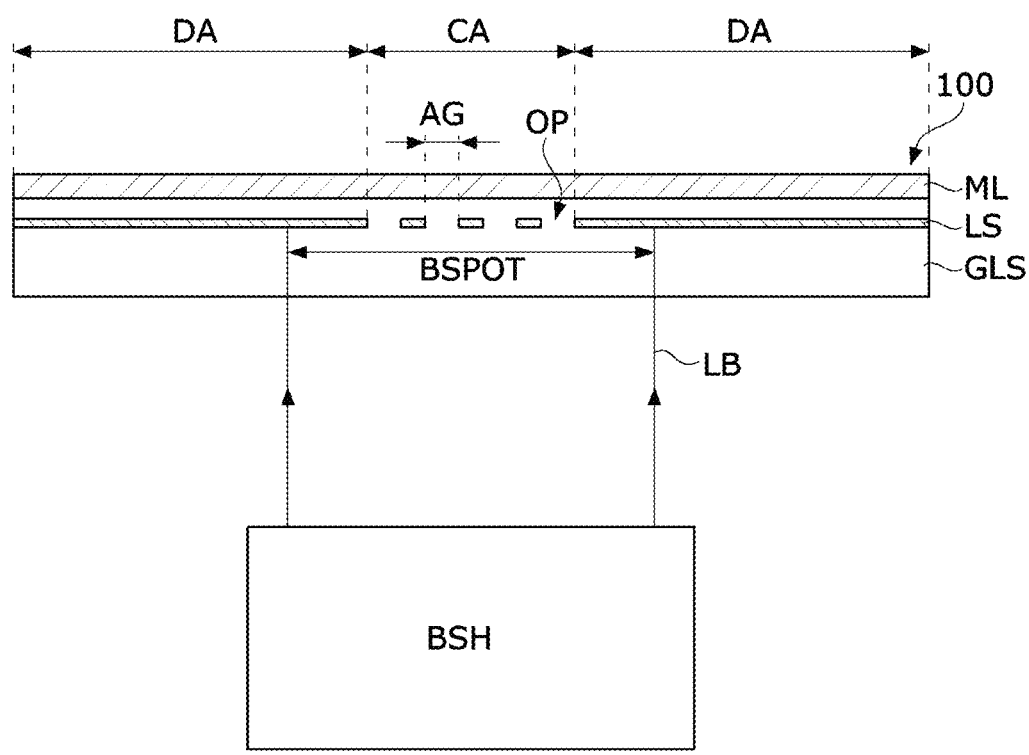
FIG. 16 is a view illustrating a schematic cross-sectional structure of the display panel according to one embodiment of the present disclosure and a laser beam irradiated in a laser ablation process.

FIG. 16 is a view illustrating a schematic cross-sectional structure of the display panel 100 according to one embodiment of the present disclosure and the laser beam irradiated in the laser ablation process.

Referring to FIG. 16, the display panel 100 includes a light shield layer LS which blocks the laser beam, and a metal layer ML exposed to the laser beam through an opening hole OP from which the light shield layer LS is removed.

The light shield layer LS is deposited on the entire first region DA and the entire second region CA, and then patterned in a photolithography process. The light shield layer LS may be formed in an entire screen region of the display panel 100, or in the pixel region other than the light transmitting parts AG in the first region DA and the second region CA as well as the first and second regions DA and CA. The light shield layer LS is removed from the opening hole OP which exposes the light transmitting parts AG of the second region CA to define the light transmitting part AG as the circular or oval light transmitting part AG. The pixel region includes regions where the pixel circuits of the pixels are disposed in the first and second regions DA and CA. In the second region CA, the pixel region includes pixels of low PPI, including the pixel groups PG disposed between the circular or oval light transmitting parts AG.

The metal layer ML is one of the metal layers required to drive the pixels of the display panel 100, and is a metal layer which should be removed from the light transmitting parts AG of the second region CA. For example, the metal layer ML may be a cathode layer of the light emitting element OLED or a metal layer formed on a layer other than the cathode layer. When the metal layer ML is a metal which should be partially removed in the laser ablation process, a wavelength of a laser beam LB is determined in a wavelength band having a high absorption coefficient for this metal.

In a laser process, the light shield layer LS should protect the metal layer ML which is present in the region other than the light transmitting parts of the second region CA from the laser beam LB generated in the laser ablation process. To this end, the light shield layer LS should be selected from materials having a low absorption coefficient at a wavelength of the laser beam LB.

When the metal layer ML is a Mg/Ag alloy thin film layer used as the cathode, since Mg has a high absorption coefficient at a wavelength of 1,064 nm, the Mg is easily removed when exposed to a laser beam having the wavelength of 1,064 nm. On the other hand, amorphous silicon (a-Si) or molybdenum (Mo) has a low absorption coefficient at the wavelength of 1,064 nm. Accordingly, when the Mg/Ag alloy thin film layer is removed by the laser beam LB having the wavelength of 1,064 nm, the Mg/Ag alloy thin film layer may be protected from the laser beam having the wavelength of 1,064 nm in the region other than the light transmitting parts by disposing the light shield layer LS under the metal layer ML with a material with the low absorption coefficient at the wavelength of 1,064 nm, such as amorphous silicon (a-Si), molybdenum (Mo), or the like.

When the light shield layer LS is formed on the display panel 100, since the metal layer ML may be protected from the laser beam LB generated in the laser ablation process in the region other than the light transmitting parts, the laser beam LB may be irradiated to the display panel 100 in a shape of a wide line beam or block beam in the laser ablation process. A length of a beam spot BSPOT of the laser beam LB irradiated to the display panel 100 in the shape of the line beam or block beam may be at least a length greater than or equal to the length of the second region CA in one direction (X-axis or Y-axis direction). When the beam spot BSPOT is larger than the second region CA, only the metal layer ML in the light transmitting part exposed through the opening hole OP from which the light shield layer LS is removed is exposed to the laser beam and then removed, but the metal layer ML in the region other than the light transmitting parts is protected from the laser beam by the light shield layer LS and thus not removed.

A laser ablation apparatus may generate a line-shaped or block-shaped beam having a uniform laser beam intensity using a beam shaper or homogenizer BSH. The line beam and the block beam may be generated according to a structure of the beam shaper BSH, and a size of the laser beam LB may be adjusted according to a distance between the beam shaper BSH and the substrate of the display panel 100.

Figure 17:
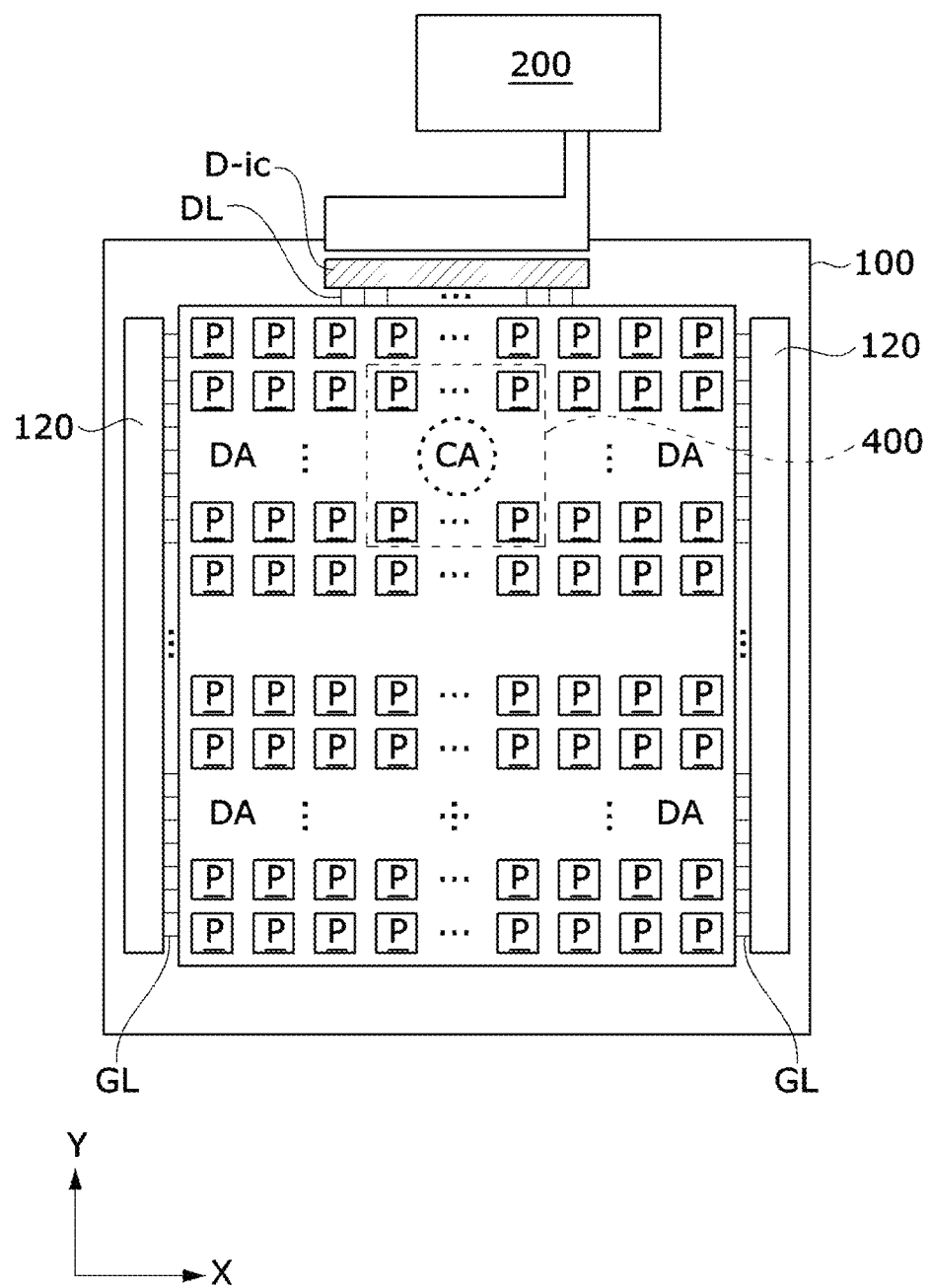
FIG. 17 is a block diagram illustrating the display panel and a display panel driving part according to one embodiment of the present disclosure.
Figure 18:
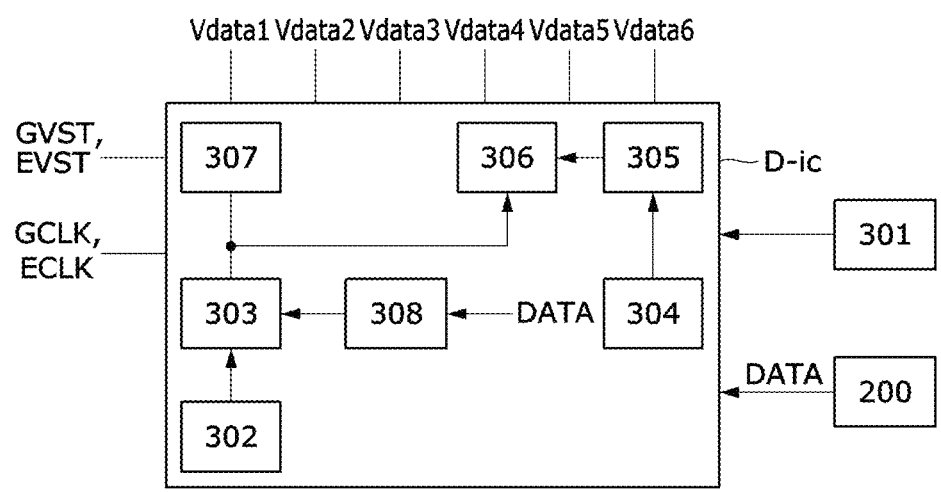
FIG. 18 is a block diagram illustrating a configuration of a drive IC shown in FIG. 17 according to an embodiment of the present disclosure.

FIG. 17 is a block diagram illustrating a display panel and a display panel driving part according to one embodiment of the present disclosure. FIG. 18 is a block diagram illustrating a configuration of a drive IC D-ic shown in FIG. 17 according to one embodiment.

Referring to FIGS. 17 and 18, the display device includes a display panel 100 in which a pixel array is disposed on the screen, a display panel driving part, and the like.

The pixel array of the display panel 100 includes data lines DL, gate lines GL which intersect the data lines DL, and pixels P arranged in a matrix form defined by the data lines DL and the gate lines GL. The pixel array may further include power lines such as a VDD line PL1, a Vini line PL2, and a VSS line PL3 shown in FIG. 19.

The pixel array may be divided into a circuit layer 12 and a light emitting element layer 14 as shown in FIG. 1. A touch sensor array may be disposed on the light emitting element layer 14. As described above, each of the pixels of the pixel array may include two to four sub-pixels. Each of the sub-pixels includes a pixel circuit disposed in the circuit layer 12.

The pixel array of the display panel 100 includes a first region DA and a second region CA.

The sub-pixels of each of the first region DA and second region CA include the pixel circuit. The pixel circuit may include a driving element which supplies a current to the light emitting element OLED, a plurality of switch elements which sample a threshold voltage of the driving element and switch a current path of the pixel circuit, a capacitor which maintains a gate voltage of the driving element, and the like. The pixel circuit is disposed under the light emitting element.

The second region CA includes light transmitting parts AG disposed between the pixel groups, and a sensor module 400 disposed under the second region CA.

The display panel driving part writes pixel data of an input image to the pixels P. The display panel driving part includes a data driving part 306 which supplies a data voltage of the pixel data to the data lines DL, and a gate driving part 120 which sequentially supplies a gate pulse to the gate lines GL. The data driving part 306 may be integrated in the drive IC D-ic. The display panel driving part may further include a touch sensor driving part omitted in the drawing.

The drive IC D-ic may be adhered to the display panel 100. The drive IC D-ic receives the pixel data DATA of the input image and a timing signal from a host system 200 to supply the data voltage Vdata1~Vdata6 of the pixel data to the pixels, and synchronizes the data driving part 306 and the gate driving part 120.

The drive IC D-ic is connected to the data lines DL through data output channels to supply the data voltage of the pixel data to the data lines DL. The drive IC D-ic may output a gate timing signal for controlling the gate driving part 120 through gate timing signal output channels. The gate timing signal generated from a timing controller 303 may include a gate start pulse VST, a gate shift clock CLK, and the like. The gate start pulse VST and the gate shift clock CLK swing between a gate-on voltage VGL and a gate-off voltage VGH. The gate timing signals VST and CLK output from a level shifter 307 are applied to the gate driving part 120 to control a shift operation of the gate driving part 120.

The gate driving part 120 may include a shift register formed in the circuit layer of the display panel 100 together with the pixel array. The shift register of the gate driving part 120 sequentially supplies gate signals to the gate lines GL under control of the timing controller 303. The gate signals may include a scan pulse and an EM pulse. The shift register may include a scan driving part which outputs the scan pulse and an EM driving part which outputs the EM pulse. In FIG. 18, GVST and GCLK are gate timing signals input to the scan driving part. EVST and ECLK are gate timing signals input to the EM driving part.

The drive IC D-ic may be connected to the host system 200, a first memory 301, and the display panel 100. The drive IC D-ic includes a data receiving and calculating part 308, the timing controller 303, a data driving part 306, a gamma compensation voltage generator 305, a power supply 304, a second memory 302, and the like.

The data receiving and calculating part 308 includes a receiving part receiving the pixel data DATA input as digital signals from the host system 200 and a data calculating part which processes the pixel data input through the receiving part to improve image quality. The data calculating part may include a data restoration part which decodes and restores compressed pixel data, and an optical compensation part which adds a predetermined optical compensation value to the pixel data. The optical compensation value is set as a value for compensating a luminance variation of the screen measured based on an image captured in a manufacturing process.

The timing controller 303 provides the pixel data of the input image received from the host system 200 to the data driving part 306. The timing controller 303 generates gate timing signals for controlling the gate driving part 120 and source timing signals for controlling the data driving part 306 to control operation timings of the gate driving part 120 and the data driving part 306.

The data driving part 306 converts the digital data including the pixel data received from the timing controller 303 through a digital to analog converter (DAC) to a gamma compensation voltage to output the data voltage. The data voltage output from the data driving part 306 is supplied to the data lines DL of the pixel array through an output buffer connected to a data channel of the drive IC D-ic.

The gamma compensation voltage generator 305 divides a gamma reference voltage from the power supply 304 through a divider circuit to generate a gamma compensation voltage for each gray level. The gamma compensation voltage is an analog voltage in which a voltage is set for each gray level of pixel data. The gamma compensation voltage output from the gamma compensation voltage generator 305 is provided to the data driving part 306.

The power supply 304 generates the power required for driving the pixel array of the display panel 100, the gate driving part 120, and the drive IC D-ic using a DC-DC converter. The DC-DC converter may include a charge pump, a regulator, a buck converter, a boost converter, and the like. The power supply 304 may adjust a DC input voltage from the host system 200 to generate DC power such as the gamma reference voltage, the gate-on voltage VGL/VEL, a gate-off voltage VGH/VEH, a pixel driving voltage VDD, a low potential power voltage VSS, and an initialization voltage Vini. The gamma reference voltage is supplied to the gamma compensation voltage generator 305. The gate-on voltage VGL and the gate-off voltage VGH are supplied to the level shifter 307 and the gate driving part 120. Pixel power, such as the pixel driving voltage VDD, the low potential power voltage VSS, the initialization voltage Vini, and the like is commonly supplied to the pixels P. The initialization voltage Vini is set to a DC voltage lower than the pixel driving voltage VDD and lower than the threshold voltage of the light emitting element OLED to initialize main nodes of the pixel circuits and restrain light emission of the light emitting element OLED.

The second memory 302 stores a compensation value, register setting data, and the like received from the first memory 301 when power is supplied to the drive IC D-ic. The compensation value may be applied to various algorithms to improve image quality. The compensation value may include the optical compensation value. The register setting data defines operations of the data driving part 306, the timing controller 303, the gamma compensation voltage generator 305, and the like. The first memory 301 may include a flash memory. The second memory 302 may include a static random-access memory (SRAM).

The host system 200 may be implemented with an application processor (AP). The host system 200 may transmit the pixel data of the input image to the drive IC D-ic through a mobile industry processor interface (MIPI). The host system 200 may be connected to the drive IC D-ic through, for example, a flexible printed circuit (FPC).

The display panel 100 may be implemented with a flexible panel applicable to a flexible display. The flexible display may be changed in screen size by rolling, folding, and bending the flexible panel, and may be easily manufactured in various designs. The flexible display may be implemented with a rollable display, a foldable display, a bendable display, a slidable display, or the like. The flexible panel may be manufactured as a plastic OLED panel. The plastic OLED panel may include a back plate and a pixel array on an organic thin film bonded to the back plate. A touch sensor array may be formed on the pixel array.

The back plate may be a polyethylene terephthalate (PET) substrate. The pixel array and the touch sensor array may be formed on the organic thin film. The back plate may block or at least reduce moisture permeation toward the organic thin film so that the pixel array may not be exposed to moisture. The organic thin film may be a polyimide (PI) substrate. A multi-layered buffer film made of an insulating material (not shown) may be formed on the organic thin film. The circuit layer 12 and the light emitting element layer 14 may be stacked on the organic thin film.

In the display device of the present disclosure, the pixel circuit may include a plurality of transistors. The transistors may be implemented as oxide thin film transistors (TFTs) including an oxide semiconductor, LTPS TFTs including low temperature polysilicon (LTPS), or the like. Each of the transistors may be implemented as a p-channel TFT or an n-channel TFT.

The transistor is a three-electrode element including a gate, a source, and a drain. The source is an electrode which supplies carriers to the transistor. In the transistor, the carriers start flowing from the source. The drain is an electrode through which the carriers exit from the transistor. In the transistor, the carriers flow from the source to the drain. In the case of the n-channel transistor (NMOS), since the carriers are electrons, a source voltage is lower than a drain voltage so that the electrons may flow from the source to the drain. In the case of the n-channel transistor, current flows in a direction from the drain to the source. In the case of the p-channel transistor (PMOS), since the carriers are holes, a source voltage is higher than a drain voltage so that the holes may flow from the source to the drain. In the p-channel transistor, since the holes flow from the source to the drain, current flows from the source to the drain. It should be noted that the source and drain of the transistor are not fixed. For example, the source and drain may be changed according to the applied voltage. Accordingly, the disclosure is not limited due to the source and drain of the transistor. In the following description, the source and drain of the transistor will be referred to as first and second electrodes.

The gate signal swings between the gate-on voltage and the gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, and is turned off in response to the gate-off voltage. In the case of the n-channel transistor, the gate-on voltage may be a gate high voltage VGH/VEH and the gate-off voltage may be a gate low voltage VGL/VEL. In the case of the p-channel transistor, the gate-on voltage may be the gate low voltage VGL/VEL, and the gate-off voltage may be the gate high voltage VGH/VEH.

Figure 19:
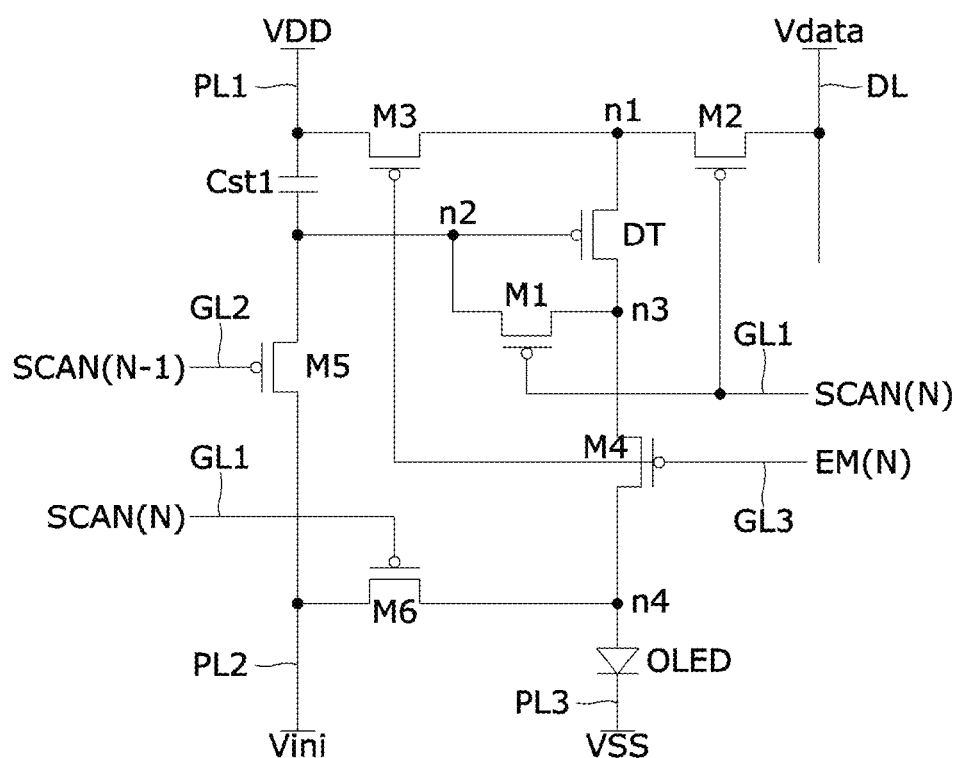
FIG. 19 is a circuit diagram illustrating an example of a pixel circuit according to an embodiment of the present disclosure.
Figure 20:
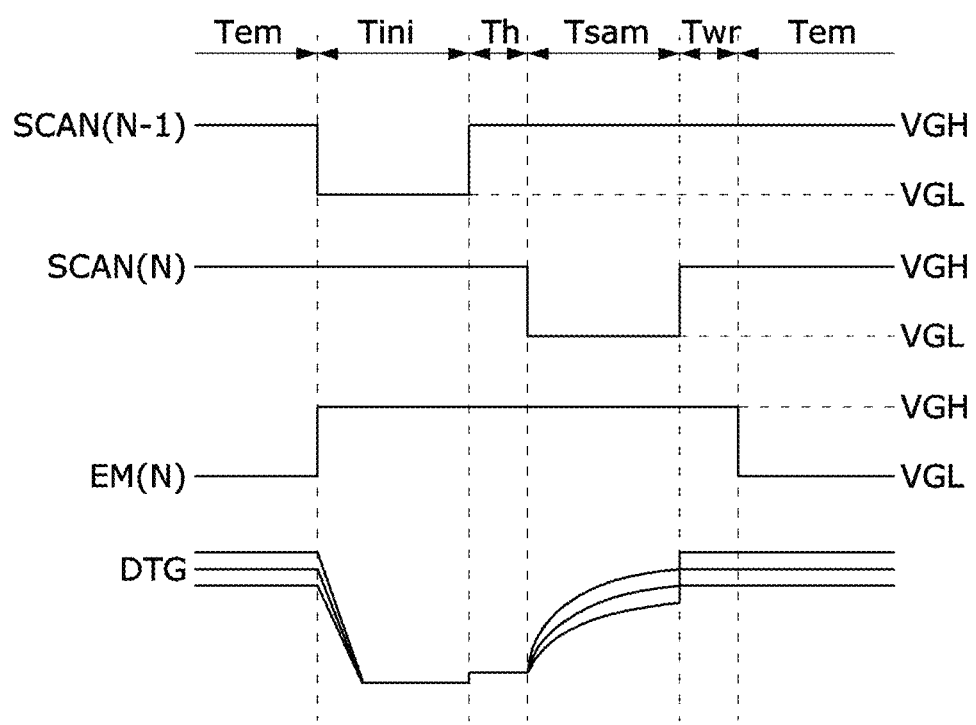
FIG. 20 is a waveform diagram illustrating a driving method of the pixel circuit shown in FIG. 19 according to an embodiment of the present disclosure.

FIG. 19 is a circuit diagram illustrating an example of a pixel circuit according to one embodiment. The pixel circuit may be implemented with the same circuit in the first and second regions DA and CA. FIG. 20 is a waveform diagram illustrating a method of driving the pixel circuit shown in FIG. 19.

Referring to FIGS. 19 and 20, the pixel circuit includes a light emitting element OLED, a driving element DT which supplies a current to the light emitting element OLED, and a switch circuit which switches a voltage applied to the light emitting element OLED and the driving element DT.

The switch circuit is connected to power lines PL1, PL2 and PL3 to which a pixel driving voltage VDD, a low potential power voltage VSS, and the initialization voltage Vini are applied, the data line DL, and the gate lines GL1, GL2, and GL3, and switches the voltage applied to the light emitting element OLED and the driving element DT in response to scan pulses SCAN(N-1) and SCAN(N) and an EM pulse EM(N).

The switch circuit includes an internal compensation circuit which samples a threshold voltage Vth of the driving element DT using first to sixth switch elements M1 to M6 and applies a data voltage Vdata of the pixel data to the driving element DT. Each of the driving element DT and the switch elements M1 to M6 may be implemented with a p-channel TFT.

A driving period of the pixel circuit may be divided into an initialization period Tini, a sampling period Tsam, and a light emission period Tem as shown in FIG. 20. For each frame period, the initialization period Tini and the sampling period Tsam are defined in the scan pulse synchronized with the data voltage Vdata. Accordingly, after the pixel circuits are sequentially initialized by one pixel line according to the scan pulse sequentially applied to the scan lines, the threshold voltage Vth of the driving element DT is sampled.

The Nth scan pulse SCAN(N) is generated as the gate-on voltage VGL during the sampling period Tsam and applied to an Nth scan line GL1. The Nth scan pulse SCAN(N) is synchronized with the data voltage Vdata applied to the pixels of an Nth pixel line. The N-1th scan pulse SCAN(N-1) is generated as the gate-on voltage VGL in the initialization period Tini prior to the sampling period and is applied to an N-1th scan line GL2. The N-1th scan pulse SCAN(N-1) is generated prior to the Nth scan pulse SCAN(N) and is synchronized with the data voltage Vdata applied to the pixels of the N-1th pixel line. The EM pulse EM(N) is generated as the gate-off voltage VGH during the initialization period Tini and the sampling period Tsam, and is applied to the EM line GL3. The EM pulse EM(N) may be simultaneously applied to the pixels of the N-1th and Nth pixel lines.

During the initialization period Tini, the N-1th scan pulse SCAN(N-1) of the gate-on voltage VGL is applied to the N-1th scan line GL2, and the EM pulse of the gate-off voltage VGH is applied to the EM line GL3. In this case, the Nth scan line GL1 is the gate-off voltage VGH. During the initialization period Tini, the fifth switch element M5 is turned on according to the gate-on voltage VGL of the N-1th scan pulse SCAN(N-1) to initialize the pixel circuit of the first region DA.

During the sampling period Tsam, the Nth scan pulse SCAN(N) of the gate-on voltage VGL is applied to the Nth scan line GL1. In this case, the N-1th scan line GL2 and the EM line GL3 are the gate-off voltage VGH. During the sampling period Tsam, since the first and second switch elements M1 and M2 are turned on according to the gate-on voltage VGL of the Nth scan pulse SCAN(N) and thus the driving element DT is turned on, the threshold voltage Vth of the driving element DT is sampled and the data voltage Vdata compensated by the threshold voltage Vth is stored in a capacitor Cst1. At the same time, the sixth switch element M6 is turned on during the sampling period Tsam to lower the voltage of a fourth node n4 to a reference voltage Vref, thereby restraining the light emission of the light emitting element OLED.

When the light emission period Tem starts, the EM line GL3 is inverted to the gate-on voltage VGL. During the light emission period Tem, the scan lines GL1 and GL2 maintain the gate-off voltage VGH. During the light emission period Tem, since the third and fourth switch elements M3 and M4 are turned on, the light emitting element OLED may emit light. During the light emission period Tem, in order to accurately express the luminance of low grayscale, a voltage level of the EM pulse EM(N) may be reversed at a predetermined duty ratio between the gate-on voltage VGL and the gate-off voltage VGH. In this case, the third and fourth switch elements M3 and M4 may repeatedly turn on/off according to the duty ratio of the EM pulse EM(N) during the light emission period Tem.

The anode of the light emitting element OLED is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. The cathode of the light-emitting element OLED is connected to the VSS line PL3 to which the low potential power supply voltage VSS is applied. The light emitting element OLED emits light with a current Ids flowing according to a gate-source voltage Vgs of the driving element DT. A current path of the light emitting element OLED is switched by the third and fourth switch elements M3 and M4.

The storage capacitor Cst1 is connected between the VDD line PL1 and a second node n2.

After the sampling period is finished, the data voltage Vdata compensated by the sampled threshold voltage Vth of the driving element DT is charged in the storage capacitor Cst1. Since the data voltage Vdata in each of the sub-pixels is compensated by the threshold voltage Vth of the driving element DT, the characteristic variation of the driving element DT is compensated for in the sub-pixels.

The first switch element M1 is turned on in response to the gate-on voltage VGL of the Nth scan pulse SCAN(N) to connect the second node n2 and a third node n3. The second node n2 is connected to a gate electrode of the driving element DT, a first electrode of the capacitor Cst1, and a first electrode of the first switch element M1. The third node n3 is connected to a second electrode of the driving element DT, a second electrode of the first switch element M1, and a first electrode of the fourth switch element M4. A gate electrode of the first switch element M1 is connected to the Nth scan line GL1 to receive the Nth scan pulse SCAN(N). The first electrode of the first switch element M1 is connected to the second node n2, and the second electrode of the first switch element M1 is connected to the third node n3.

Since the first switch element M1 is turned on during very short one horizontal period (1H) in which the Nth scan pulse SCAN(N) is generated as the gate-on voltage VGL in one frame period, a leakage current may occur in an off state. In order to restrain the leakage current of the first switch element M1, the first switch element M1 may be implemented with a transistor having a dual gate structure in which two transistors are connected in series.

The second switch element M2 is turned on in response to the gate-on voltage VGL of the Nth scan pulse SCAN(N) to supply the data voltage Vdata to the first node n1. A gate electrode of the second switch element M2 is connected to the Nth scan line GL1 to receive the Nth scan pulse SCAN(N). A first electrode of the second switch element M2 is connected to the first node n1. The second electrode of the second switch element M2 is connected to the data lines DL of the first region DA to which the data voltage Vdata is applied. The first node n1 is connected to the first electrode of the second switch element M2, a second electrode of the third switch element M3, and a first electrode of the driving element DT The third switch element M3 is turned on in response to the gate-on voltage VGL of the EM pulse EM(N) to connect the VDD line PL1 to the first node n1. A gate electrode of the third switch element M3 is connected to the EM line GL3 to receive the EM pulse EM(N). A first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to connect the third node n3 to the anode of the light emitting element OLED. A gate electrode of the fourth switch element M4 is connected to the EM line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N−1th scan pulse SCAN (N−1) to connect the second node n2 to the Vini line PL2. A gate electrode of the fifth switch element M5 is connected to the N−1th scan line GL2 to receive the N−1th scan pulse SCAN(N−1). A first electrode of the fifth switch element M5 is connected to the second node n2, and a second electrode is connected to the Vini line PL2. In order to restrain the leakage current of the fifth switch element M5, the fifth switch element M5 is implemented with a transistor having a dual gate structure in which two transistors are connected in series.

The sixth switch element M6 is turned on in response to the gate-on voltage VGL of the Nth scan pulse SCAN(N) to connect the Vini line PL2 to the fourth node n4. A gate electrode of the sixth switch element M6 is connected to the Nth scan line GL1 to receive the Nth scan pulse SCAN(N). A first electrode of the sixth switch element M6 is connected to the Vini line PL2, and a second electrode is connected to the fourth node n4.

In another embodiment, the gate electrodes of the fifth and sixth switch elements M5 and M6 may be commonly connected to the N−1th scan line GL2 to which the N−1th scan pulse SCAN(N−1) is applied. In this case, the fifth and sixth switch elements M5 and M6 may be simultaneously turned on in response to the N−1th scan pulse SCAN(N−1).

The driving element DT drives the light emitting element OLED by controlling the current flowing through the light emitting element OLED according to the gate-source voltage Vgs. The driving element DT includes a gate electrode connected to the second node n2, the first electrode connected to the first node n1, and the second electrode connected to the third node n3.

During the initialization period Tini, the N−1th scan pulse SCAN(N−1) is generated as the gate-on voltage VGL. The Nth scan pulse SCAN(N) and the EM pulse EM(N) maintain the gate-off voltage VGH during the initialization period Tini. Accordingly, since the fifth switch element M5 is turned on during the initialization period Tini, the second and fourth nodes n2 and n4 are initialized to the initialization voltage Vini. A hold period Th may be set between the initialization period Tini and the sampling period Tsam. In the hold period Th, the voltages of the scan lines GL1 and GL2 and the EM lines GL3 are the gate-off voltage VGH.

During the sampling period Tsam, the Nth scan pulse SCAN(N) is generated as the gate-on voltage VGL. The pulse of the Nth scan pulse SCAN(N) is synchronized with the data voltage Vdata of the Nth pixel line. The N−1th scan pulse SCAN(N−1) and the EM pulse EM(N) maintain the gate-off voltage VGH during the sampling period Tsam. Accordingly, the first and second switch elements M1 and M2 are turned on during the sampling period Tsam.

During the sampling period Tsam, a gate voltage DTG of the driving element DT is increased by the current flowing through the first and second switch elements M1 and M2. When the driving element DT is turned off, the gate voltage DTG of the driving element DT is Vdata−|Vth|, and a source voltage of the driving element DT is VDD−|Vth|. Accordingly, when the sampled threshold voltage Vth of the driving element DT is stored in the capacitor Cst1, the gate-source voltage Vgs of the driving element DT is VDD-Vdata. Accordingly, a current holed flowing through the light emitting element OLED during the light emitting period Tem is not affected by the threshold voltage Vth of the driving element DT. A write period Twr may be set between the sampling period Tsam and the light emitting period Tem. In the write period Twr, the voltages of the scan lines GL1 and GL2 and the EM lines GL3 are the gate-off voltage VGH. In the write period Twr, a data voltage is further applied to the data lines.

When the EM pulse EM(N) is the gate-on voltage VGL during the light emission period Tem, since the current flows between the VDD and the light emitting element OLED, the light emitting element OLED may emit light. During the light emission period Tem, the N−1th and Nth scan pulses SCAN(N−1) and SCAN(N) maintain the gate-off voltage VGH. During the light emission period Tem, the third and fourth switch elements M3 and M4 are turned on according to the gate-on voltage VGL of the EM pulse EM(N). When the EM pulse EM(N) is the gate-on voltage VGL, since the third and fourth switch elements M3 and M4 are turned on, the current flows through the light emitting element OLED. In this case, the current Ioled flowing through the light emitting element OLED through the driving element DT is Ioled=K(VDD−Vdata)$^2$. K is a constant value determined by charge mobility, a parasitic capacitance, a channel ratio (W (width)/L (length)), and the like of the driving element DT.

In the pixel circuit, the current Ioled flowing through the light emitting element OLED increases as the data voltage Vdata output from the data driving part 306 is lower. Accordingly, the data driving part 306 outputs the data voltage Vdata as a negative gamma compensation voltage of which voltage decreases as the gray level increases.

Figure 21:
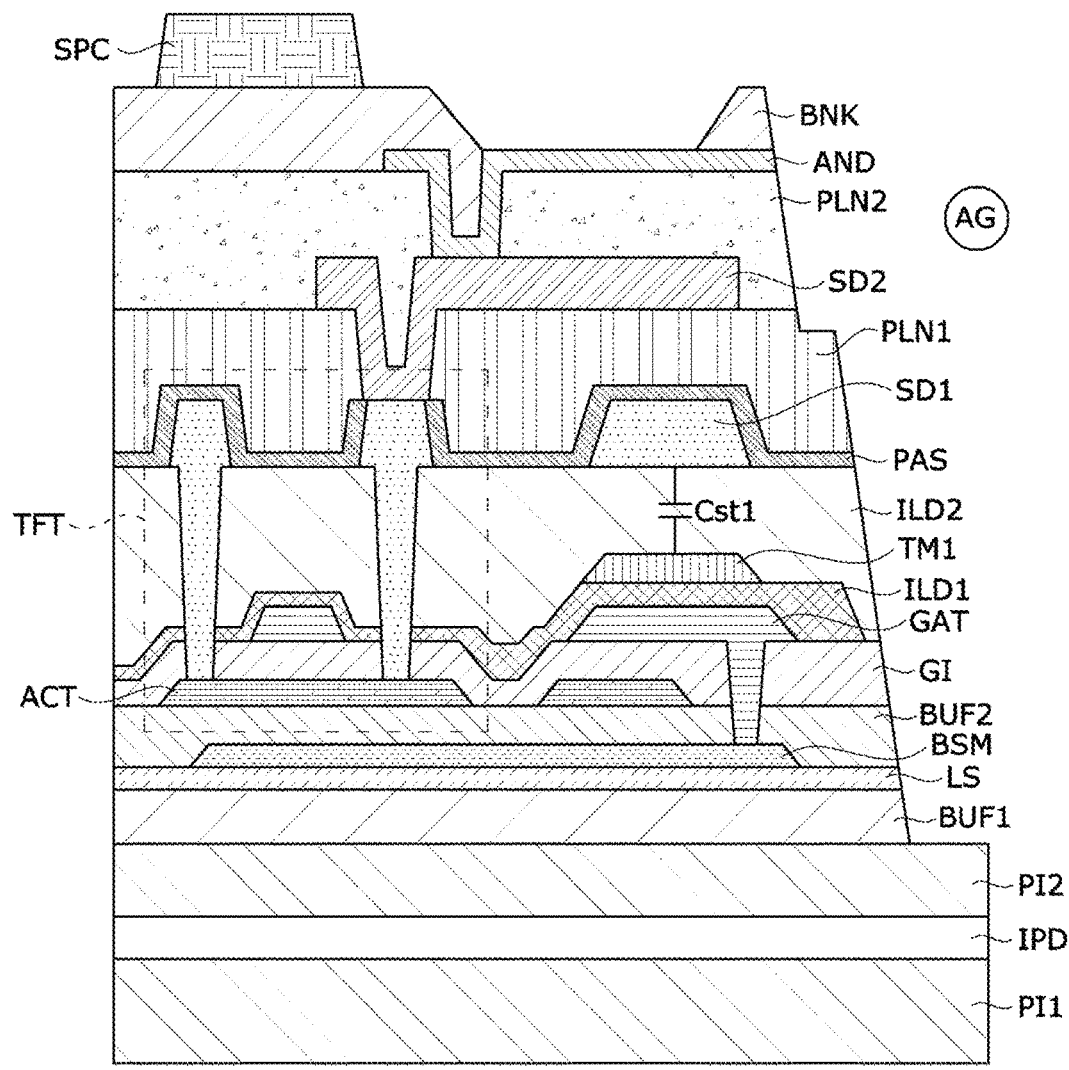
FIG. 21 is a cross-sectional view illustrating a cross-sectional structure of a circuit layer according to one embodiment of the present disclosure in detail.

FIG. 21 is a cross-sectional view illustrating a cross-sectional structure of the circuit layer 12 according to one embodiment of the present disclosure in detail. It should be noted that the cross-sectional structure of the circuit layer 12 is not limited to FIG. 21. In FIG. 21, the TFT may be a transistor used as the driving element DT of the pixel circuit or the fourth switch element M4.

Referring to FIG. 21, the circuit layer 12, the light emitting element layer 14, and the like may be stacked on substrates PI1 and PI2. The substrates PI1 and PI2 may include a first PI substrate PI1 and a second PI substrate PI2. An inorganic film IPD may be formed between the first PI substrate PI1 and the second PI substrate PI2. The inorganic film IPD blocks moisture penetration.

A first buffer layer BUF1 may be formed on the second PI substrate PI2. The first buffer layer BUF1 may be formed of a multi-layered insulating film in which two or more oxide films SiO$_2$ and nitride films SiN$_x$ are stacked. A first metal layer may be formed on the first buffer layer BUF1. A second buffer layer BUF2 may be formed on the first metal layer. The second buffer layer BUF2 may be formed of an inorganic insulating material and may be formed of one or more insulating layers.

The first metal layer is patterned in the photolithography process. The first metal layer may include the light shield layer LS. The light shield layer LS may be disposed under the transistor TFT and the capacitor Cst1.

The light shield layer LS may prevent or at least reduce a defect which causes a ghost phenomenon in an imaged image by reflecting light reflected from the sensor module back to the sensor module. Further, as described above, since the light shield layer LS is selected as a material having a low absorption rate with respect to the laser wavelength in the laser ablation process, the cathode may remain in a region other than the light transmitting part AG from the laser beam.

The light shield layer LS may be formed of one of materials each having a lower absorption coefficient of the laser wavelength used in the laser ablation process compared to the cathode layer of the light emitting element OLED to be removed in the second region CA, for example, amorphous silicon (a-Si) and molybdenum (Mo). When the light shield layer LS is formed of amorphous silicon (a-Si), the light shield layer LS is effective in preventing or at least reducing the ghost phenomenon in the imaged image by absorbing light reflected by the sensor module.

The first metal layer may further include a bottom shield metal BSM formed on the light shield layer LS. The bottom shield metal BSM may be formed of copper/molitanium (Cu/MoTi) in which copper (Cu) and molitanium (MoTi) are stacked, but is not limited thereto.

The light shield layer LS and the bottom shield metal BSM may be formed of a metal having a low absorption coefficient of the laser wavelength used in the laser ablation process, for example, molybdenum (Mo). In this case, since the light shield layer LS and the bottom shield metal BSM may be implemented with a single metal layer, the bottom shield metal BSM may be omitted.

When at least one of the light shield layer LS and the bottom shield metal BSM is formed of a metal, since external light is blocked so that the light is not irradiated to a semiconductor channel of the transistor TFT, it is possible to prevent or at least reduce the leakage current and deterioration of the transistor TFT due to the external light. A DC voltage such as the pixel driving voltage VDD is applied to the light shield layer LS and the bottom shield metal BSM to block ions which affect the active layer ACT of the transistor TFT and thus a threshold voltage change may be restrained.

Since the bottom shield metal BSM is disposed under the transistor and the opening hole OP of the light shield layer LS faces the light transmitting parts AG of the second region CA, the planar and cross-sectional pattern shapes of the bottom shield metal BSM and the light shield layer LS may be different each other.

An active layer ACT is formed of a semiconductor material deposited on the second buffer layer BUF2 and may be patterned by a photolithography process. The active layer ACT includes a semiconductor channel of the pixel circuit. A portion of the active layer ACT may be metallized by ion doping. The metallized portion may connect nodes of the pixel circuit and the transistor.

A gate insulating layer GI may be formed on the second buffer layer BUF2 to cover the active layer ACT. The gate insulating layer GI may be formed of an inorganic insulating material. A second metal layer may be formed on the gate insulating layer GI. The second metal layer may be patterned by a photolithography process. The second metal layer may include gate lines and a gate electrode pattern GAT, a lower electrode of the storage capacitor Cst1, and the like.

A first interlayer insulating layer ILD1 may be formed on the gate insulating layer GI to cover the second metal layer. A third metal layer may be formed on the first interlayer insulating layer ILD1, and a second interlayer insulating layer ILD2 may cover the third metal layer. The third metal layer may be patterned by a photolithography process. The third metal layer may include an upper electrode of the storage capacitor Cst1. The first and second interlayer insulating layers ILD1 and ILD2 may include an inorganic or organic insulating material.

A fourth metal layer may be formed on the second interlayer insulating layer ILD2, and an inorganic insulating layer PAS and a first planarization layer PLN1 may be stacked thereon. A fifth metal layer may be formed on the first planarization layer PLN1.

Some patterns of the fourth metal layer may be connected to the fifth metal layer through a contact hole passing through the first planarization layer PLN1 and the inorganic insulating layer PAS. The first and second planarization layers PLN1 and PLN2 may be formed of an organic insulating material which flattens a surface.

The fourth metal layer may include the first and second electrodes of the transistor TFT connected to the active pattern of the transistor TFT through a contact hole passing through the second interlayer insulating layer ILD2. The data lines DL and the power lines PL1, PL2, and PL3 may be implemented as a third metal layer pattern TM1, a fourth metal layer pattern SD1, or a fifth metal layer pattern SD2.

An anode AND of the light emitting element OLED may be formed on the second planarization layer PLN2. The anode AND may be connected to the electrodes of the transistor TFT used as a switch element or a driving element through a contact hole passing through the second planarization layer PLN2. The anode AND may be formed of a transparent or translucent electrode material.

A pixel definition film BNK may cover the anode AND of the light emitting element OLED. The pixel definition film BNK is formed in a pattern which defines a light emitting region (or an opening region) through which light passes from each of the pixels to the outside. A spacer SPC may be formed on the pixel definition film BNK. The pixel definition film BNK and the spacer SPC may be integrated with the same organic insulating material. The spacer SPC secures a gap between a fine metal mask (FMM) and the anode AND so that the FMM does not come into contact with the anode AND in a deposition process of an emission layer (organic compound layer).

An organic compound layer omitted in the drawings is formed in the light emitting region of each of the pixels defined by the pixel definition film BNK. The cathode of the light emitting element OLED may be formed on the entire surface of the display panel 100 to cover the pixel definition film BNK, the spacer SPC, and the organic compound layer. The cathode may be connected to the VSS line PL3 formed of any one of the metal layers thereunder.

Figure 22:
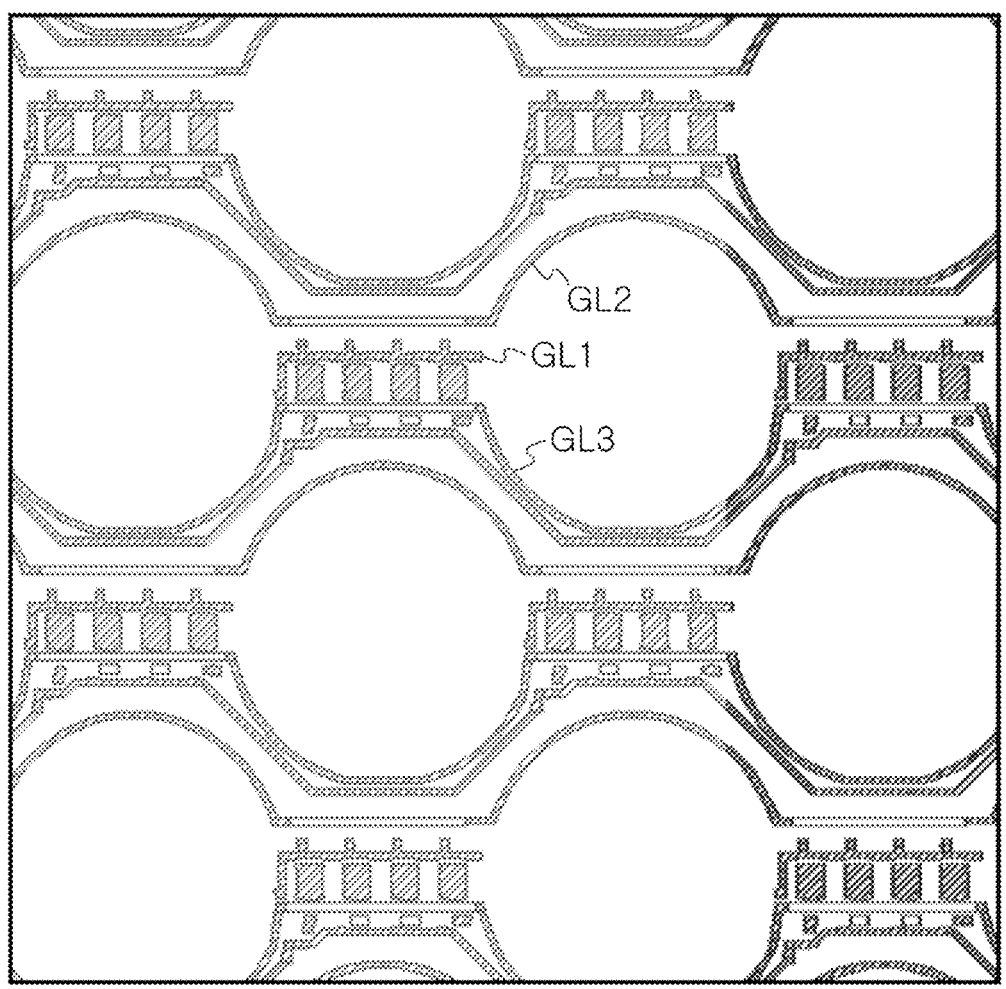
FIG. 22 is a plan view illustrating a pattern of a second metal layer according to an embodiment of the present disclosure.
Figure 23:
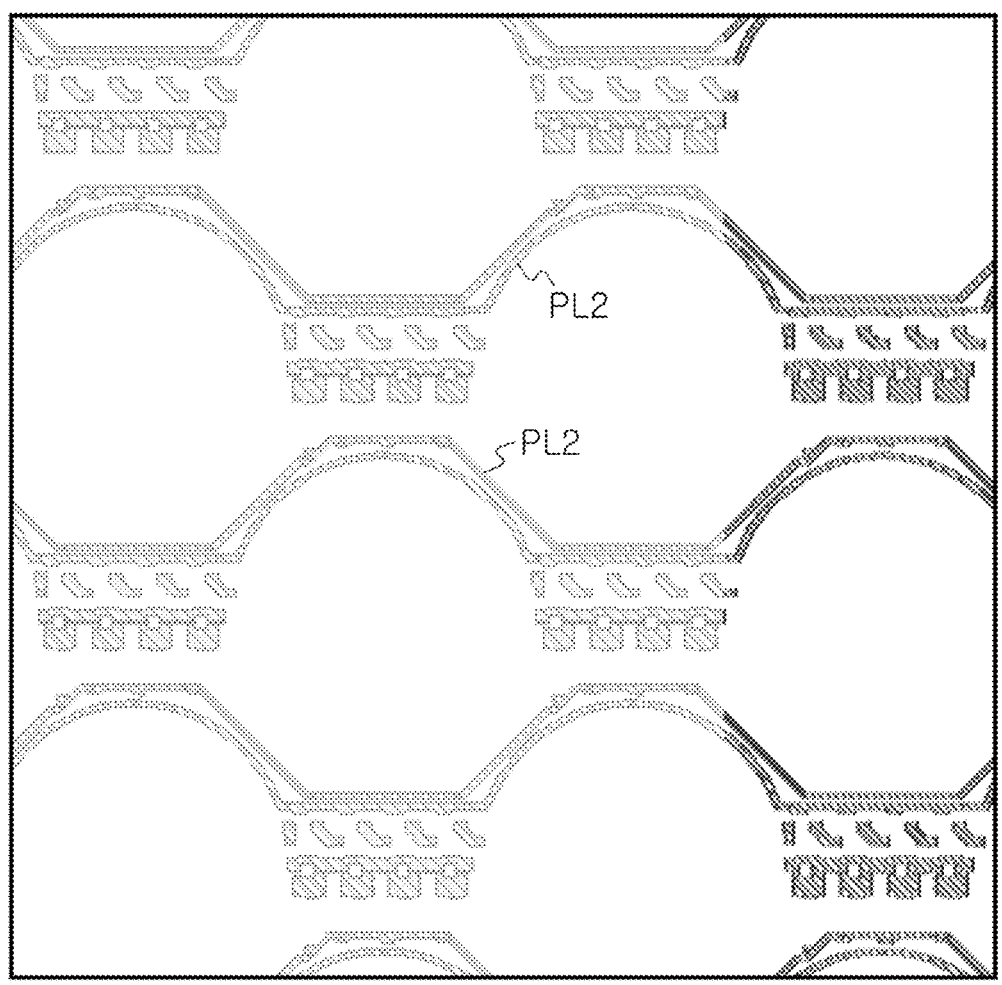
FIG. 23 is a plan view illustrating a pattern of a third metal layer according to an embodiment of the present disclosure.
Figure 24:
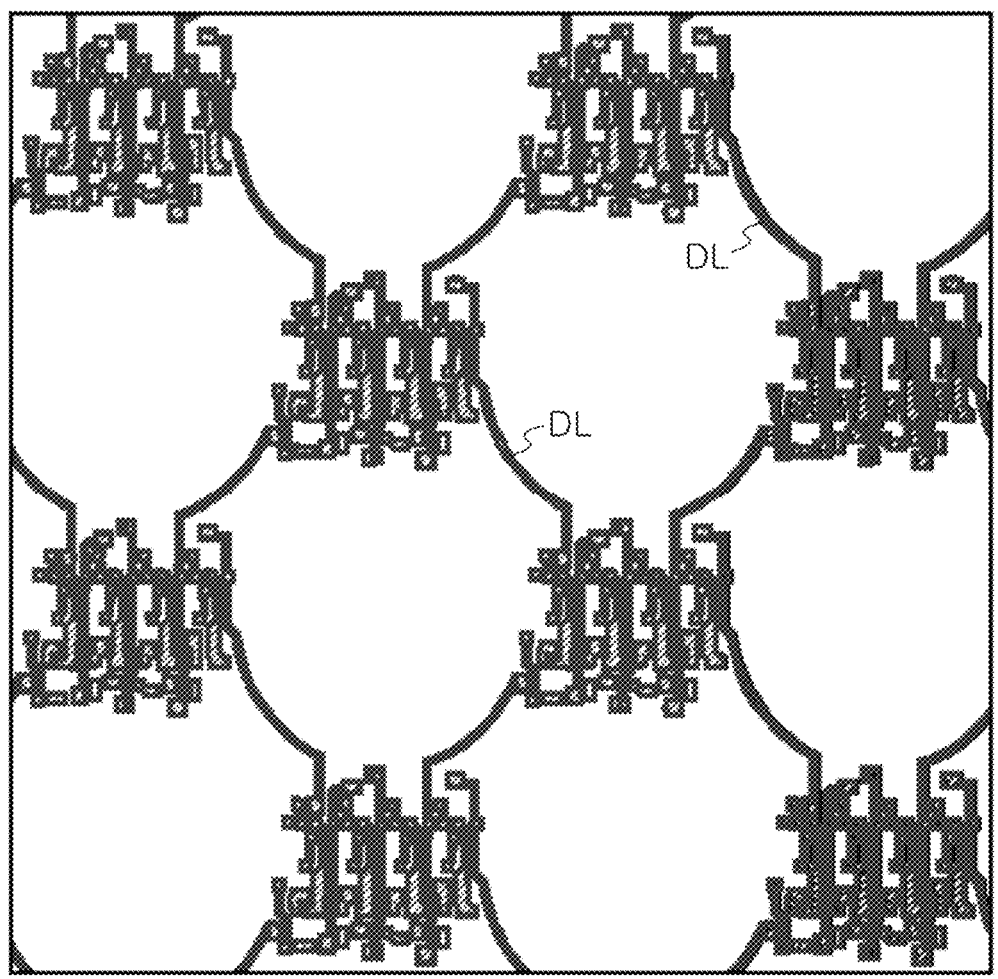
FIG. 24 is a plan view illustrating a pattern of a fourth metal layer according to an embodiment of the present disclosure.
Figure 25:
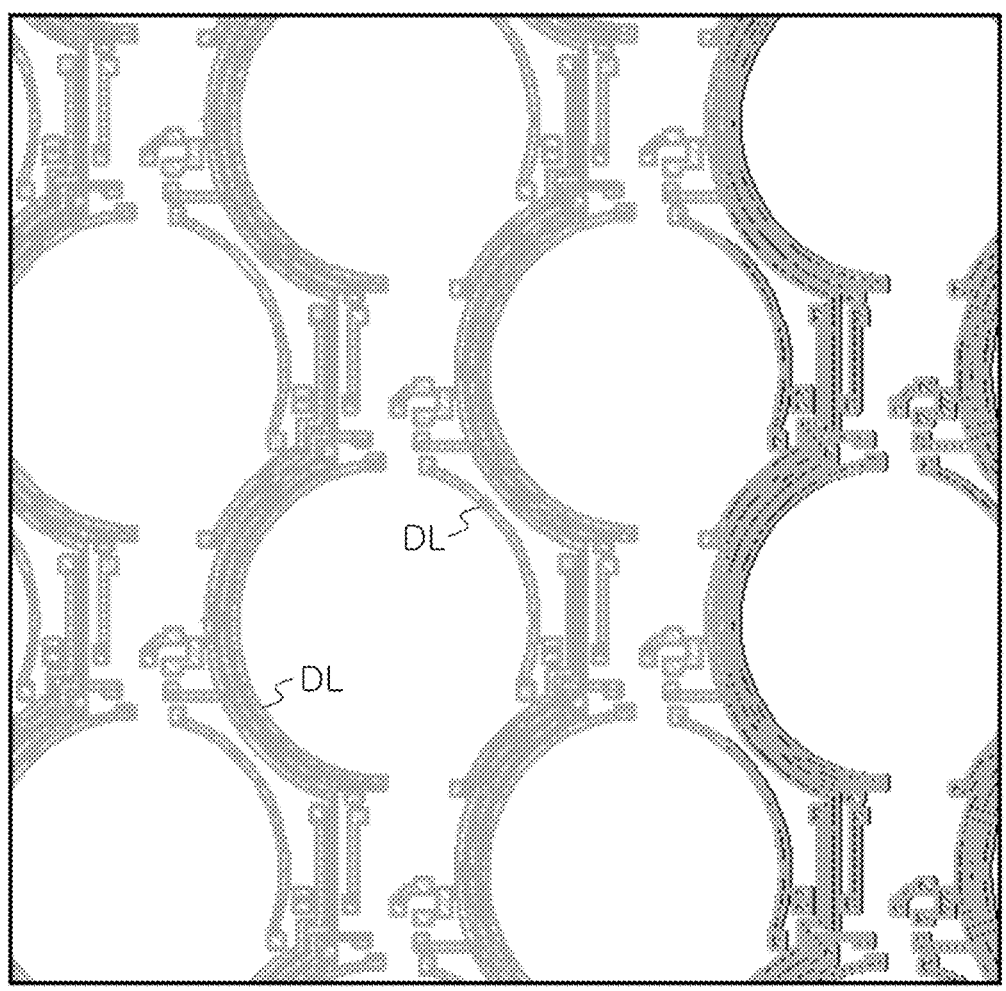
FIG. 25 is a plan view illustrating a pattern of a fifth metal layer according to an embodiment of the present disclosure.
Figure 26:
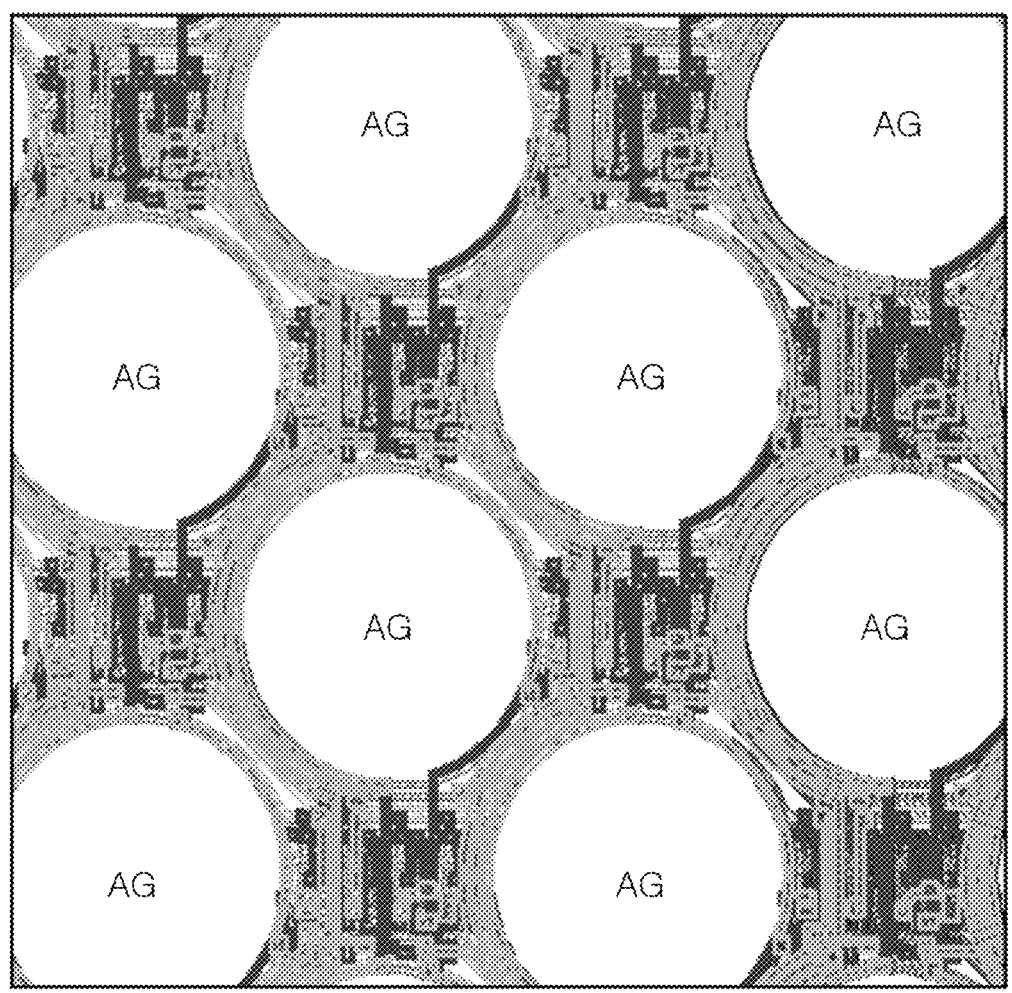
FIG. 26 is a plan view illustrating a stacked structure of the second to fifth metal layers according to an embodiment of the present disclosure.

The pixel circuit and at least one of the signal lines DL and GL, and the power lines PL1, PL2, and PL3 connected to the pixel circuit may include a curved pattern which defines the circular or oval light transmitting part AG as shown in FIGS. 22 to 25. FIG. 22 is a plan view illustrating a pattern of the second metal layer according to one embodiment. The second metal layer may include the gate lines GL1, GL2, and GL3. One or more of the gate lines GL1, GL2, and GL3 may include a curved pattern bent along an outer periphery of the circular or oval light transmitting part AG. FIG. 23 is a plan view illustrating a pattern of the third metal layer according to one embodiment. The third metal layer may include the Vini line PL2. The Vini line PL2 may include a curved pattern bent along the outer periphery of the circular or oval light transmitting part AG. FIG. 24 is a plan view illustrating a pattern of the fourth metal layer according to one embodiment. FIG. 25 is a plan view illustrating a pattern of the fifth metal layer according to one embodiment. The fourth and fifth metal layers may include the data line DL. The data line DL may include a curved pattern bent along the outer periphery of the circular or oval light transmitting part AG. FIG. 26 is a plan view illustrating a stacked structure of the second to fifth metal layers according to one embodiment.

As can be seen in FIGS. 22 to 26, when metal patterns formed in two or more circuit layers are designed as curved patterns along an outer peripheral shape of the circular or oval light transmitting part, the light transmitting part may be defined as a circular or oval shape without the light shield layer LS. Accordingly, when the curved pattern which defines the circular or oval light transmitting part AG is applied to the metal layers, the light shield layer LS may be removed, but the light shield layer LS may absorb the light reflected by the sensor module. Accordingly, a curved pattern design of the light shield layer LS and the metal layer may be applied together.

In the present disclosure, since a sensor is disposed on a screen on which an image is displayed, a screen of a full-screen display can be implemented.

In the present disclosure, pixels in some regions of the screen on which the sensor is disposed are disposed in a low pixels per inch (PPI), circular or oval light transmitting parts are disposed in a zigzag shape, and an aspect ratio of a pixel group disposed between the light transmitting parts is optimized so that the light transmitting parts can be enlarged. Accordingly, in the present disclosure, not only the transmittance of light incident on the sensor through the display panel can be increased, but also the quality of an imaged image can be increased by disposing the circular or oval light transmitting parts in the zigzag shape and improving a flare phenomenon in the imaged image obtained from the sensor.

Effects which can be achieved by the present disclosure are not limited to the above-mentioned effects. That is, other objects that are not mentioned may be obviously understood by those skilled in the art to which the present disclosure pertains from the following description.

The objects to be achieved by the present disclosure, the means for achieving the objects, and effects of the present disclosure described above do not specify essential features of the claims, and thus, the scope of the claims is not limited to the specific description of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:
 a first region where a first plurality of pixel groups are disposed; and
 a second region where a second plurality of pixel groups and a plurality of light transmitting parts are disposed,
  wherein each of the plurality of light transmitting parts includes a circular or oval light transmitting part and the plurality of light transmitting parts are disposed in a plurality of rows in a first direction and a plurality of columns in a second direction in a zigzag shape in the second region in a plan view of the display panel,
  wherein in the zigzag shape a portion of a first light transmitting part in a first column from the plurality of columns is overlapped in the first direction by at least a second light transmitting part in a second column from the plurality of columns,
  wherein the second plurality of pixel groups disposed in the second region are disposed between the plurality of light transmitting parts,
  an aspect ratio of each of the second plurality of pixel groups disposed in the second region is different from that of each of the first plurality of pixel groups disposed in the first region, and each of the second plurality of pixel groups of the second region includes a same number of sub-pixels as each of the first plurality of pixel groups of the first region, wherein a longitudinal length of the pixel group from the second plurality of pixel groups disposed in the second region is greater than a longitudinal length of the pixel group from the first plurality of pixel groups disposed in the first region, and a lateral length of the pixel group from the second plurality of pixel groups disposed in the second region is a same as a lateral length of the pixel group from the first plurality of pixel groups disposed in the first region, wherein the pixel group from the second plurality of pixel groups of the second region includes:
 a red sub-pixel having a longitudinal length in a longitudinal direction that is greater than a lateral length in a lateral direction of the red sub-pixel, a first green sub-pixel having a longitudinal length in the longitudinal direction that is greater than a lateral length in the lateral direction of the first green sub-pixel, and a blue sub-pixel having a longitudinal length in the longitudinal direction that is greater than a lateral length in the lateral direction of the blue sub-pixel, the red sub-pixel, the first green sub-pixel, and the blue sub-pixel disposed along the lateral direction such that the first green sub-pixel is between the red sub-pixel and the blue sub-pixel in the lateral direction without another sub-pixel between the red sub-pixel and a first side of the first green sub-pixel in the lateral direction and without another sub-pixel between the blue sub-pixel and a second side of the first green sub-pixel in the lateral direction; and
 a second green sub-pixel disposed on or under the red sub-pixel, the first green sub-pixel, and the blue sub-pixel, the second green sub-pixel having a longitudinal length in the longitudinal direction that is less than the lateral length of the second green sub-pixel in the lateral direction.

2. The display panel of claim 1, wherein each of the first plurality of pixel groups of the first region and the second plurality of pixel groups of the second region includes three or four sub-pixels in a square-shaped or rhombus-shaped pixel region.

3. The display panel of claim 1, wherein a ratio of a minimum diameter and a maximum diameter of the oval light transmitting part is 1:1.3 or less.

4. The display panel of claim 3, wherein a length in a maximum radial direction of the oval light transmitting part is set to be 1.3 times or less than a length in a minimum radial direction of the oval light transmitting part in each of the second plurality of pixel groups of the second region.

5. The display panel of claim 1, comprising a circuit layer in which a pixel circuit of the sub-pixels is disposed in the second region,
 wherein the circuit layer includes a light shield layer disposed in a pixel region excluding the light transmitting parts,
 the light shield layer includes amorphous silicon (a-Si) or molybdenum (Mo).

6. The display panel of claim 5, wherein:
 the circuit layer includes a metal layer including signal lines and power lines connected to the pixel circuit; and
 one or more of the signal lines and the power lines include a curved pattern bent along an outer periphery of a circular or oval light transmitting part included in the light transmitting part.

7. The display panel of claim 1, wherein the second region has less pixels per inch compared to the first region.

8. A display device comprising:
 a display panel including:
  a first region where a first plurality of pixel groups are disposed, and
  a second region where a second plurality of pixel groups and a plurality of light transmitting parts are disposed,
  wherein each of the plurality of light transmitting parts includes a circular or oval light transmitting part and the plurality of light transmitting parts are disposed in a plurality of rows in a first direction and a plurality of columns in a second direction in a zigzag shape in the second region in a plan view of the display panel,
  wherein in the zigzag shape a portion of a first light transmitting part in a first column from the plurality of columns is overlapped in the first direction by at least a second light transmitting part in a second column from the plurality of columns,
 one or more sensor modules disposed under the second region of the display panel to photoelectrically convert light received through the second region; and
 a display panel driving part configured to write pixel data to pixels of the first plurality of pixel groups disposed in the first region and to pixels of the second plurality of pixel groups disposed in the second region,
wherein the second plurality of pixel groups disposed in the second region are disposed between the plurality of light transmitting parts,
an aspect ratio of each of the second plurality of pixel groups disposed in the second region is different from that of each of the first plurality of pixel groups disposed in the first region, and
each of the second plurality of pixel groups of the second region includes a same number of sub-pixels as each of the first plurality of pixel groups of the first region,
wherein a longitudinal length of a pixel group from the second plurality of pixel groups disposed in the second region is greater than a longitudinal length of a pixel group from the first plurality of pixel groups disposed in the first region, and a lateral length of the pixel group from the second plurality of pixel groups disposed in the second region is a same as a lateral length of the pixel group from the first plurality of pixel groups disposed in the first region,
wherein the pixel group from the second plurality of pixel groups of the second region includes:
 a red sub-pixel having a longitudinal length in a longitudinal direction that is greater than a lateral length in a lateral direction of the red sub-pixel, a first green sub-pixel having a longitudinal length in the longitudinal direction that is greater than a lateral length in the lateral direction of the first green sub-pixel, and a blue sub-pixel having a longitudinal length in the longitudinal direction that is greater than a lateral length in the lateral direction of the blue sub-pixel, the red sub-pixel, the first green sub-pixel, and the blue sub-pixel disposed along the lateral direction such that the first green sub-pixel is between the red sub-pixel and the blue sub-pixel in the lateral direction without another sub-pixel between the red sub-pixel and a first side of the first green sub-pixel in the lateral direction and without another sub-pixel between the blue sub-pixel and a second side of the first green sub-pixel in the lateral direction; and a second green sub-pixel disposed on or under the red sub-pixel, the first green sub-pixel, and the blue sub-pixel, the second green sub-pixel having a longitudinal length in the longitudinal direction that is less than the lateral length of the second green sub-pixel in the lateral direction.

9. The display device of claim 8, wherein each of the first plurality of pixel groups of the first region and each of the second plurality of pixel groups of the second region includes three or four sub-pixels in a square-shaped or rhombus-shaped pixel region.

10. The display device of claim 8, wherein a ratio of a minimum diameter and a maximum diameter of the oval light transmitting part is 1:1.3 or less.

11. The display device of claim 10, wherein a length in a maximum radial direction of the oval light transmitting part is set to be 1.3 times or less than a length in a minimum radial direction of the oval light transmitting part in each of the second plurality of pixel groups of the second region.

12. The display device of claim 8, wherein a light shield layer is disposed in a pixel region other than the plurality of light transmitting parts in the first region and the second region.

\* \* \* \* \*